(12) United States Patent
Yokoyama

(10) Patent No.: US 7,566,943 B2
(45) Date of Patent: Jul. 28, 2009

(54) PHOTOELECTRIC CONVERSION DEVICE AND SOLID-STATE IMAGING DEVICE

(75) Inventor: Daisuke Yokoyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 183 days.

(21) Appl. No.: 11/714,202

(22) Filed: Mar. 6, 2007

(65) Prior Publication Data

US 2007/0205477 A1 Sep. 6, 2007

(30) Foreign Application Priority Data

Mar. 6, 2006 (JP) ............... 2006-059968
Dec. 25, 2006 (JP) ............... 2006-347565

(51) Int. Cl.
H01L 31/00 (2006.01)

(52) U.S. Cl. ............ 257/448; 257/30; 257/292; 257/458

(58) Field of Classification Search ............ 257/30, 257/292, 448, 458
See application file for complete search history.

(56) References Cited

U.S. PATENT DOCUMENTS 5,965,875 A  10/1999 Merrill
6,127,692 A * 10/2000 Sugawa et al. ............ 257/30
6,632,701 B2  10/2003 Merrill
2008/0035965 A1 * 2/2008 Hayashi et al. ............ 257/291
2008/0246107 A1 * 10/2008 Maehara ............ 257/432

FOREIGN PATENT DOCUMENTS

JP  07-038136 A  2/1995
JP  2003-332551 A  11/2003

* cited by examiner

Primary Examiner—Phuc T Dang
(74) Attorney, Agent, or Firm—Sughrue Mion, PLLC

(57) ABSTRACT

A photoelectric conversion device including a photoelectric conversion part including a pair of electrodes and a photoelectric conversion layer provided between the pair of electrodes, wherein the photoelectric conversion part further includes a first charge blocking layer for reducing an injection of a charge into the photoelectric conversion layer from one of the pair of electrodes when a voltage is applied between the pair of electrodes, the first charge blocking layer being provided between the one of the pair of electrodes and the photoelectric conversion layer; and the first charge blocking layer has a relative dielectric constant larger than a relative dielectric constant of the photoelectric conversion layer.

27 Claims, 8 Drawing Sheets

PHOTOELECTRIC CONVERSION DEVICE AND SOLID-STATE IMAGING DEVICE

FIELD OF THE INVENTION

The present invention relates to a photoelectric conversion device including a photoelectric conversion part containing a pair of electrodes and a photoelectric conversion layer disposed between the pair of electrodes.

BACKGROUND OF THE INVENTION

Conventional devices for optical sensing have a photodiode (PD) in a semiconductor substrate such as silicon (Si) generally. As a solid-state imaging device, there is widely employed a planar solid-state imaging device in which PDs are two-dimensionally arranged in a semiconductor substrate and a signal corresponding to signal charges generated from each PD by photoelectric conversion is read out by a CCD or CMOS circuit. As a method of realizing a color solid-state imaging device, a general structure has color filters each of which is able to transmit only light having a specified wavelength therethrough and arranged for the color separation in a side of the light incident face of a planar solid-state imaging device. In particular, as a system which is widely employed at present for digital cameras and so on, there is well known a single-plate solid-state imaging device in which color filters which are able to transmit blue (B) light, green (G) light and red (R) light, respectively therethrough are regularly arranged on respective two-dimensionally arranged PDs.

However, in the single-plate solid-state imaging device, since the color filter transmits only light of a limited wavelength therethrough, light which has not transmitted through the color filter is not utilized, resulting in the loss of the light use efficiency. Also, with progress of high integration of pixel, the size of PD becomes the same in size as the wavelength of visible light, whereby the light is hardly guided into PD. Also, since blue light, green light and red light are detected by separate PDs adjacent to each other and then subjected to arithmetic processing, thereby achieving color reproduction, a false color may possibly be generated. In order to avoid this false color, an optical low-pass filter is necessary, resulting in the generation of an optical loss by this filter.

There have hitherto been reported color sensors in which three PDs are stacked within a silicon substrate by utilizing the wavelength dependency of an absorption coefficient of silicon and color separation is carried out due to a difference in depth on the p-n junction of each PD (see U.S. Pat. No. 5,965,875, U.S. Pat. No. 6,632,701 and JP-A-7-38136). However, such a system involves a problem that the wavelength dependency of spectral sensitivity in the stacked PDs is so broad that the color separation is insufficient. In particular, the color separation between blue and green colors is insufficient.

In order to solve this problem, there is proposed a sensor with a photoelectric conversion part on the upper side of a silicon substrate. A photoelectric conversion part detects green light and generates a signal charge corresponding thereto and blue light and red light are detected by two PDs stacked within the silicon substrate (see JP-A-2003-332551). The photoelectric conversion part on the upper side of the silicon substrate is configured to include a first electrode stacked on the silicon substrate, a photoelectric conversion layer which is made of an organic material stacked on the first electrode and a second electrode stacked on the photoelectric conversion layer. This photoelectric conversion part is configured such that when a voltage is applied between the first electrode and the second electrode, a signal charge generated within the photoelectric conversion layer transfers into the first electrode and the second electrode and a signal corresponding to the signal charge transferred into either one of the electrode layers is read out by a CCD or CMOS circuit provided within the silicon substrate or the like. In this specification, the "photoelectric conversion layer" as referred to herein means a layer capable of absorbing incident light having a specified wavelength and generating charges (electrons and holes) corresponding to the quantity of absorbed light.

SUMMARY OF THE INVENTION

In the foregoing photoelectric conversion part, the larger the electric field strength to be applied to the inside of the photoelectric conversion layer, the larger the external quantum efficiency upon irradiation with light in the photoelectric conversion layer. However, in the case where a large external voltage is applied, when an electron and a hole are injected into the photoelectric conversion layer from the electrodes interposing the photoelectric conversion layer therebetween, a dark current increases, and an S/N ratio is deteriorated.

Under such circumstances, the invention has been made. An object of the invention is to prevent a dark current in a photoelectric conversion device including a photoelectric conversion part having the foregoing configuration.

The photoelectric conversion device of the invention is a photoelectric conversion device including a photoelectric conversion part containing a pair of electrodes and a photoelectric conversion layer disposed between the pair of electrodes, wherein the photoelectric conversion part is provided with a first charge blocking layer for reducing the injection of a charge into the photoelectric conversion layer from one of the pair of electrodes at the application of a voltage to the pair of electrodes between the one of the pair of electrodes and the photoelectric conversion layer; and the first charge blocking layer has a relative dielectric constant larger than a relative dielectric constant of the photoelectric conversion layer.

In the photoelectric conversion device of the invention, the photoelectric conversion part is provided with a second charge blocking layer for reducing the injection of a charge into the photoelectric conversion layer from other of the pair of electrodes at the application of a voltage to the pair of electrodes between the other of the pair of electrodes and the photoelectric conversion layer; and the second charge blocking layer has a relative dielectric constant larger than a relative dielectric constant of the photoelectric conversion layer.

In the photoelectric conversion device of the invention, a value obtained by dividing a thickness of the photoelectric conversion layer by the relative dielectric constant of the photoelectric conversion layer is larger than a value obtained by dividing a thickness of the first charge blocking layer by the relative dielectric constant of the first charge blocking layer.

In the photoelectric conversion device of the invention, a value obtained by dividing a thickness of the photoelectric conversion layer by the relative dielectric constant of the photoelectric conversion layer is larger than the sum of a value obtained by dividing a thickness of the first charge blocking layer by the relative dielectric constant of the first charge blocking layer and a value obtained by dividing a thickness of the second charge blocking layer by the relative dielectric constant of the second charge blocking layer.

In the photoelectric conversion device of the invention, the first charge blocking layer has a thickness of from 10 to 200 nm.

In the photoelectric conversion device of the invention, the first charge blocking layer has a relative dielectric constant of 5 or more.

In the photoelectric conversion device of the invention, the first charge blocking layer is transparent.

In the photoelectric conversion device of the invention, a value obtained by dividing a voltage externally applied to the pair of electrodes by the sum of a thickness of the first charge blocking layer and a thickness of the photoelectric conversion layer is from $1.0 \times 10^5$ V/cm to $1.0 \times 10^7$ V/cm.

In the photoelectric conversion device of the invention, the first charge blocking layer is made of an inorganic material.

In the photoelectric conversion device of the invention, each of the first charge blocking layer and the second charge blocking layer has a thickness of from 10 to 200 nm.

In the photoelectric conversion device of the invention, each of the first charge blocking layer and the second charge blocking layer has a relative dielectric constant of 5 or more.

In the photoelectric conversion device of the invention, each of the first charge blocking layer and the second charge blocking layer is transparent.

In the photoelectric conversion device of the invention, a value obtained by dividing a voltage externally applied to the pair of electrodes by the sum of a thickness of the first charge blocking layer, a thickness of the second charge blocking layer and a thickness of the photoelectric conversion layer is from $1.0 \times 10^5$ V/cm to $1.0 \times 10^7$ V/cm.

In the photoelectric conversion device of the invention, each of the first charge blocking layer and the second charge blocking layer is made of an inorganic material.

In the photoelectric conversion device of the invention, the inorganic material is an inorganic oxide.

In the photoelectric conversion device of the invention, the photoelectric conversion layer has a relative dielectric constant of 3 or more.

In the photoelectric conversion device of the invention, the photoelectric conversion layer is made of an organic material.

In the photoelectric conversion device of the invention, at least one of the pair of electrodes is a transparent electrode.

In the photoelectric conversion device of the invention, both of the pair of electrodes are a transparent electrode.

In the photoelectric conversion device according of the invention, of the pair of electrodes, the electrode in a light incident side is an electrode for collecting electrons generated in the photoelectric conversion layer.

The photoelectric conversion device is provided with a semiconductor substrate having at least one of the photoelectric conversion part stacked on the upper side thereof; a charge storage part for storing a charge generated in the photoelectric conversion layer in the photoelectric conversion part, as formed within the semiconductor substrate; and a connecting part for electrically connecting the electrode for collecting a charge of the pair of electrodes in the photoelectric conversion part to the charge storage part.

In the photoelectric conversion device of the invention, an in-substrate photoelectric conversion part for absorbing light which has transmitted through the photoelectric conversion layer of the photoelectric conversion part, generating a charge corresponding to the light and storing it is provided within the semiconductor substrate.

In the photoelectric conversion device of the invention, the in-substrate photoelectric conversion part is made of plural photodiodes for absorbing light of a different color, respectively, as stacked within the semiconductor substrate.

In the photoelectric conversion device of the invention, the in-substrate photoelectric conversion part is made of plural photodiodes for absorbing light of a different color, respectively, as arranged in a direction vertical to an incident direction of the incident light within the semiconductor substrate.

In the photoelectric conversion device of the invention, one of the photoelectric conversion part is stacked on the upper side of the semiconductor substrate; the plural photodiodes are a photodiode having a p-n junction formed in a suitable position for absorbing blue light and a photodiode having a p-n junction formed in a suitable position for absorbing red light; and the photoelectric conversion layer in the photoelectric conversion part absorbs green light.

In the photoelectric conversion device of the invention, the charge stored in the charge storing part is electrons; and of the pair of electrodes of the photoelectric conversion part, the electrode in the light incident side is the electrode for collecting the electrons.

The solid-state imaging device of the invention is a solid-state imaging device including a number of the foregoing photoelectric conversion device, as disposed in an array state, wherein a signal read-out part for reading out a signal corresponding to the charge stored in the charge storing part of each of the plural photoelectric conversion devices is provided.

According to the invention, a dark current can be prevented by a photoelectric conversion device including a photoelectric conversion part having the foregoing configuration.

DESCRIPTION OF REFERENCE NUMERALS AND SIGNS

100, 102: Electrode
101: Photoelectric conversion layer

103: Hole blocking layer
104: Electron blocking layer

DETAILED DESCRIPTION OF THE INVENTION

Embodiments of the invention will be hereunder described with reference to the accompanying drawings.

In the foregoing photoelectric conversion part, the larger the electric field strength to be applied to the inside of the photoelectric conversion layer, the larger the external quantum efficiency upon irradiation with light in the photoelectric conversion layer. However, in the case where a large external voltage is applied, when an electron and a hole are injected into the photoelectric conversion layer from the electrodes interposing the photoelectric conversion layer therebetween, a dark current increases, and an S/N ratio is deteriorated. As one of countermeasures for reducing this dark current, there is enumerated a method of providing a charge blocking layer for reducing the injection of a charge into the photoelectric conversion layer from the electrode between the electrode and the photoelectric conversion layer.

The charge blocking layer includes a hole blocking layer having a large hole injection barrier from an electrode adjacent thereto and having a mobility of an electron as a light current carrier higher than a mobility of a hole; and an electron blocking layer having a large electron, injection barrier from an electrode adjacent thereto and having a mobility of a hole as a light current carrier higher than a mobility of an electron. As described in JP-A-11-339966 and JP-A-2002-329582, in organic light-emitting devices and so on, a blocking layer using an organic material is already used for preventing the penetration of a carrier through a light-emitting layer. By interposing such an organic blocking layer between an electrode and a photoelectric conversion layer in a photoelectric conversion part, when an external voltage is applied, the photoelectric conversion efficiency or responsivity can be improved without decreasing an S/N ratio.

As a material which is used for the hole blocking layer, materials in which an ionization potential thereof is at least a work function of a material of the adjacent electrode and an electron affinity thereof is at least an electron affinity of a material of the adjacent photoelectric conversion layer are used. As a material which is used for the electron blocking layer, materials in which an electron affinity thereof is not more than a work function of a material of the adjacent electrode and an ionization potential thereof is not more than an ionization potential of a material of the adjacent photoelectric conversion layer.

A photoelectric conversion device including a photoelectric conversion part containing such a charge blocking layer is hereunder described.

Figure 1:
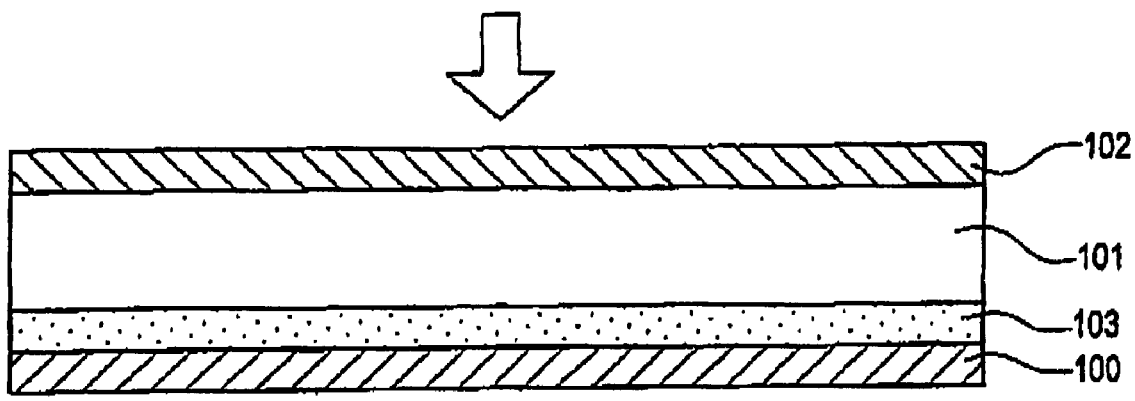
FIG. 1 is a schematic cross-sectional view to show an outline configuration of a photoelectric conversion device for explaining an embodiment of the invention.

FIG. 1 is a schematic cross-sectional view to show an outline configuration of a photoelectric conversion device for explaining an embodiment of the invention.

A photoelectric conversion device as illustrated in FIG. 1 is configured to include a photoelectric conversion part containing a pair of an electrode 100 and an electrode 102 opposing to each other; a photoelectric conversion layer 101 made of an organic material and formed between the electrode 100 and the electrode 102; and a hole blocking layer 103 formed between the photoelectric conversion layer 101 and the electrode 100. In the photoelectric conversion device as illustrated in FIG. 1, since light is made incident from an upper part of the electrode 102, the electrode 102 works as an electrode in the light incident side. In the photoelectric conversion device as illustrated in FIG. 1, a voltage is applied to the electrodes 100 and 102 such that of charges (namely, holes and electrons) generated in the photoelectric conversion layer 101, the hole is moved into the electrode 102, whereas the electrons are moved into the electrode 100 (namely, the electrode 100 works as an electrode for collecting electrons).

As a material of the hole blocking layer 103, materials in which an ionization potential thereof is at least a work function of a material of the adjacent electrode 100 and an electron affinity thereof is at least an electron affinity of a material of the adjacent photoelectric conversion layer 101 are used. By providing this hole blocking layer 103 between the electrode 100 and the photoelectric conversion layer 101, when a voltage is applied to the electrodes 100 and 102, not only an electron generated in the photoelectric conversion layer 101 can be moved into the electrode 100, but also the injection of a hole from the electrode 100 into the photoelectric conversion layer 101 can be prevented.

In the photoelectric conversion device having such a configuration, how the relationship between a relative dielectric constant of the photoelectric conversion layer 101 and a relative dielectric constant of the hole blocking layer 103 is important is described below.

Figure 2A:
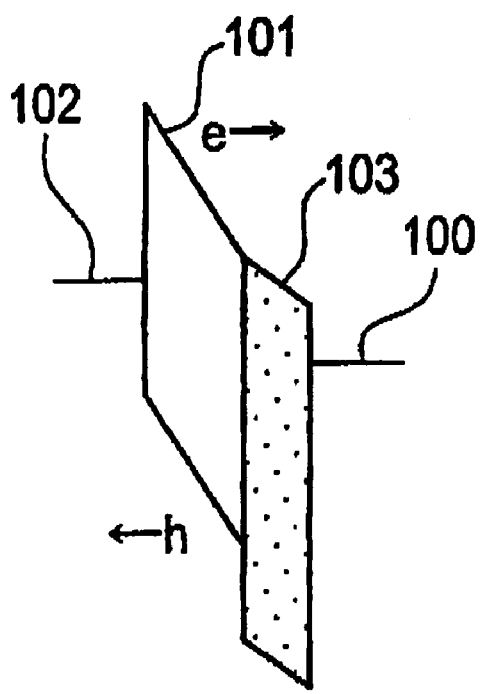
FIGS. 2A and 2B are each a view to show an energy diagram of the photoelectric conversion device of FIG. 1.
Figure 2B:
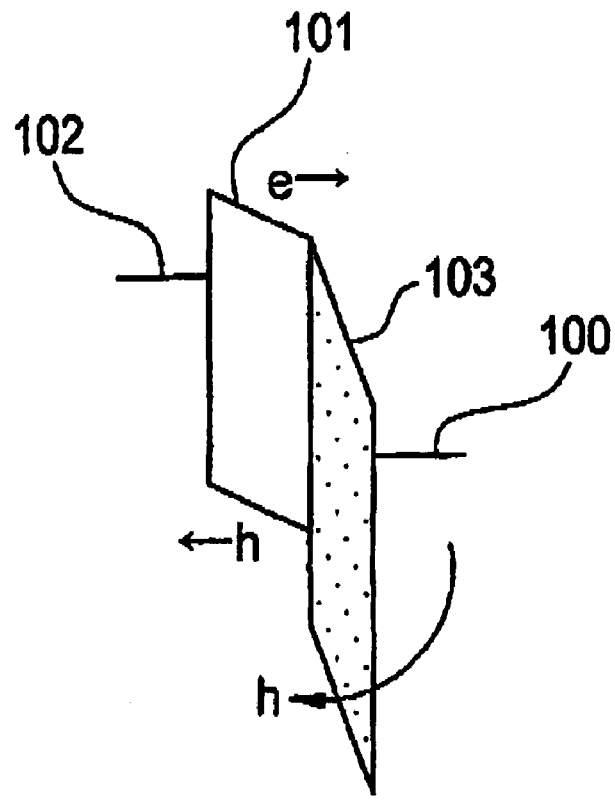

An energy diaphragm in a state that the relative dielectric constant of the hole blocking layer 103 is smaller than the relative dielectric constant of the photoelectric conversion layer 101 and that an external voltage is applied between the electrodes 100 and 102 is illustrated in FIG. 23. In FIG. 2B, the same symbols as in FIG. 1 are given to energies of the respective configurative elements as illustrate in FIG. 1. When the relative dielectric constant of the hole blocking layer 103 is smaller than the relative dielectric constant of the photoelectric conversion layer 101, almost all of the external voltage is applied to the hole blocking layer 103, thereby forming the energy diaphragm as illustrated in FIG. 2B. In the photoelectric conversion layer 101, by applying a strong electric field, since the dissociation efficiency of an exciton generated by light absorption can be enhanced and the external quantum efficiency can be improved, it is possible to improve the sensitivity. However, as illustrated in FIG. 2B, when a large quantity of the voltage is applied to the hole blocking layer 103 and an electric field applied to the photoelectric conversion layer 101 becomes weak, the external quantum efficiency is lowered, leading to a lowering of the sensitivity. For that reason, in order to increase the external quantum efficiency, the external voltage is required to be large, and a consumed electric power increases.

For the purpose of increasing the external quantum efficiency, when the external voltage is made large, a stronger electric field is applied to the hole blocking layer 103 for that. Thus, the hole to be injected from the electrode 100 into the photoelectric conversion layer 101 increases, and it becomes difficult to sufficiently achieve the control of a hole injection current, an aspect of which should be originally expected for the hole blocking layer 103, Examples of an injection mechanism include thermal excitation injection and tunnel injection. In all of these cases, when the electric field to be applied to the blocking layer becomes strong, the amount of the injected charge increases.

Then, the photoelectric conversion device as illustrated in FIG. 1 is characterized in that the relative dielectric constant of the hole blocking layer 103 is larger than the relative dielectric constant of the photoelectric conversion layer 101. An energy diaphragm in a state that the relative dielectric constant of the hole blocking layer 103 is larger than the relative dielectric constant of the photoelectric conversion layer 101 and that an external voltage is applied between the electrodes 100 and 102 is illustrated in FIG. 2A. In this way, since the major part of the external voltage is applied to the photoelectric conversion layer 101, even when the external voltage is not excessively increased, the external quantum efficiency can be increased.

Since the electric field to be applied to the hole blocking layer 103 can be also made small, it is possible to sufficiently obtain an effect for reducing a hole injection current, an aspect of which should be originally expected for the hole blocking layer 103, without causing an increase of the hole injected from the electrode 100 into the photoelectric conversion layer 101.

With respect to a material of the photoelectric conversion layer 101, it is known that when the relative dielectric constant is high, the exciton generated by light absorption is liable to be dissociated, and the external quantum efficiency becomes high. For that reason, with respect to the material of the photoelectric conversion layer 101, materials having a high relative dielectric constant are desirable, and the relative dielectric constant is preferably 3 or more. Examples of the material of the photoelectric conversion layer 101 having a relative dielectric constant of 3 or more include a vacuum vapor deposited layer of quinacridone (relative dielectric constant: about 3.9).

With respect to the relative dielectric constant of the hole blocking layer 103, a large relative dielectric constant is desirable. The relative dielectric constant is preferably 5 or more, and more preferably 10 or more. Since organic materials are generally small in the relative dielectric constant as compared with inorganic material, it is preferable that an inorganic material is used as the material of the hole blocking layer 103. Of inorganic materials, many inorganic oxides have a high relative dielectric constant and therefore, are more preferable. Examples of a material which is made of an inorganic oxide having a relative dielectric constant of 5 or more and which can be the material of the hole blocking layer 103 include $CeO_2$ (relative dielectric constant: about 26) and $SnO_2$ (relative dielectric constant: about 10). However, the material is required to be selected such that the relative dielectric constant of the hole blocking layer 103 is larger than the relative dielectric constant of the photoelectric conversion layer 101.

Incidentally, even when the relative dielectric constant of the hole blocking layer 103 is larger than the relative dielectric constant of the photoelectric conversion layer 101, if the thickness of the hole blocking layer 103 is too thick, the voltage which is applied to the hole blocking layer 103 becomes large. For that reason, taking into consideration the thickness of the hole blocking layer 103, it is more preferable that a value obtained by dividing the thickness of the photoelectric conversion layer 101 by the relative dielectric constant of the photoelectric conversion layer 101 is larger than a value obtained by dividing the thickness of the hole blocking layer 103 by the relative dielectric constant of the hole blocking layer 103.

The thickness of the hole blocking layer 103 is most preferably from 10 nm to 200 nm. This is because since a carrier generated in the photoelectric conversion layer 101 is required to be collected, when this thickness is too thick, though the blocking properties are improved, the external quantum efficiency is lowered.

It is preferable that a value obtained by dividing the voltage externally applied to the electrodes 100 and 102 by the sum of the thickness of the hole blocking layer 103 and the thickness of the photoelectric conversion layer 101 is in the range of from $1.0 \times 10^5$ V/cm to $1.0 \times 10^7$ V/cm.

In the photoelectric conversion device as illustrated in FIG. 1, since light is required to be made incident into the photoelectric conversion layer 101, it is preferable that the electrode 102 is a transparent electrode. It is meant by the term "transparent" as referred to herein that the electrode transmits 80% or more of visible light having a wavelength in the range of from about 420 nm to about 660 nm therethrough.

There may be the case where the photoelectric conversion device as illustrated in FIG. 1 is required to transmit light in a lower part of the electrode 100, too as described later. Accordingly, it is preferable that the electrode 100 is a transparent electrode. Also, it is preferable that the hole blocking layer 103 is transparent.

Figure 3:
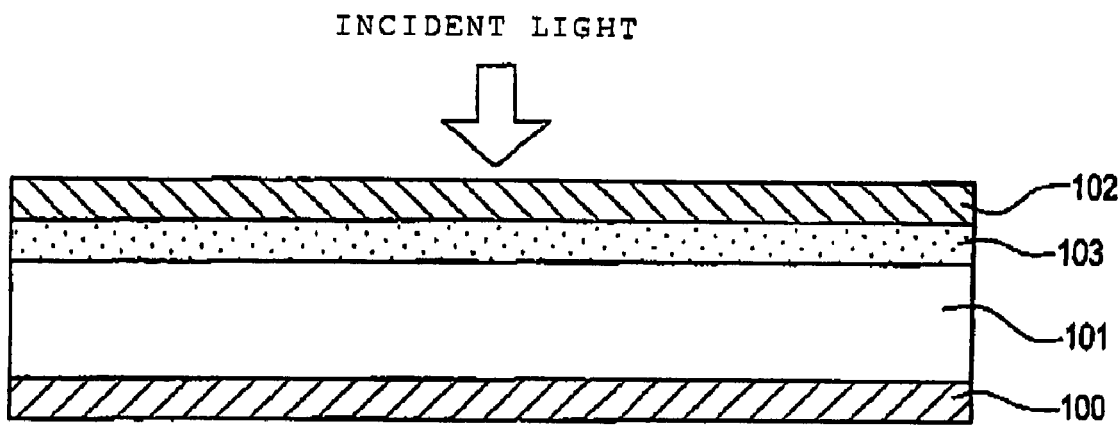
FIG. 3 is a view to show a modification example of the photoelectric conversion device of FIG. 1.

In the photoelectric conversion device as illustrated in FIG. 1, in the case where a voltage is applied to the electrodes 100 and 102 such that of charges generated in the photoelectric conversion layer 101 (namely, holes and electrons), the electrons are moved into the electrode 102, whereas the holes are moved into the electrode 100 (namely, the case where the electrode 102 works as an electrode for collecting electrons), the photoelectric conversion device may be configured to provide the hole blocking layer 103 between the electrode 102 and the photoelectric conversion layer 101 as illustrated in FIG. 3. In that case, the hole blocking layer 103 is required to be transparent.

Next, a configuration in which an electron blocking layer is provided is described.

Figure 4:
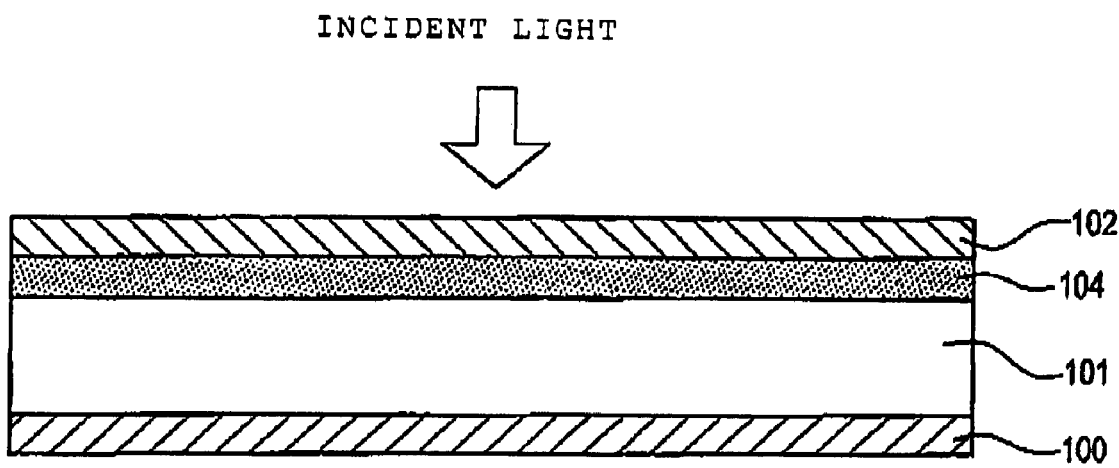
FIG. 4 is a schematic cross-sectional view to show an outline configuration of a photoelectric conversion device for explaining an embodiment of the invention.

FIG. 4 is a schematic cross-sectional view to show an outline configuration of a photoelectric conversion device for explaining an embodiment of the invention. In FIG. 4, the same configurations as in FIG. 1 are given the same symbols.

A photoelectric conversion device as illustrated in FIG. 4 is configured to include a photoelectric conversion part containing a pair of an electrode 100 and an electrode 102 opposing to each other; a photoelectric conversion layer 101 formed between the electrode 100 and the electrode 102; and an electron blocking layer 104 formed between the photoelectric conversion layer 101 and the electrode 102. In the photoelectric conversion device as illustrated in FIG. 4, since light is made incident from an upper part of the electrode 102, the electrode 102 works as an electrode in the light incident side. In the photoelectric conversion device as illustrated in FIG. 4, a voltage is applied to the electrodes 100 and 102 such that of charges (namely, holes and electrons) generated in the photoelectric conversion layer 101, the holes are moved into the electrode 102, whereas the electrons are moved into the electrode 100 (namely, the electrode 100 works as an electrode for collecting electrons).

As a material of the electron blocking layer 104, materials in which an electron affinity thereof is not more than a work function of a material of the adjacent electrode 102 and an ionization potential thereof is not more than an ionization potential of a material of the adjacent photoelectric conversion layer 101 are used. By providing this electron blocking layer 104 between the electrode 102 and the photoelectric conversion layer 101, when a voltage is applied to the electrodes 100 and 102, not only a hole generated in the photoelectric conversion layer 101 can be moved into the electrode 102, but also the injection of an electron from the electrode 102 into the photoelectric conversion layer 101 can be prevented.

In the photoelectric conversion device having such a configuration, how the relationship between a relative dielectric constant of the photoelectric conversion layer 1001 and a relative dielectric constant of the electron blocking layer 104 is important, too is described below.

Figure 5A:
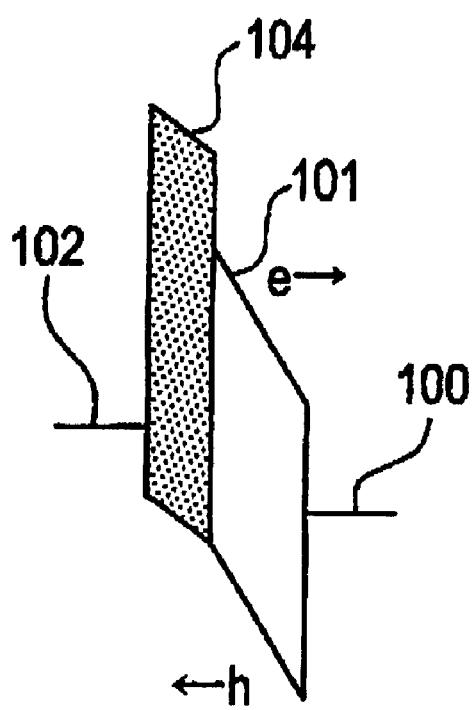
FIGS. 5A and 5B are each a view to show an energy diagram of the photoelectric conversion device of FIG. 4.
Figure 5B:
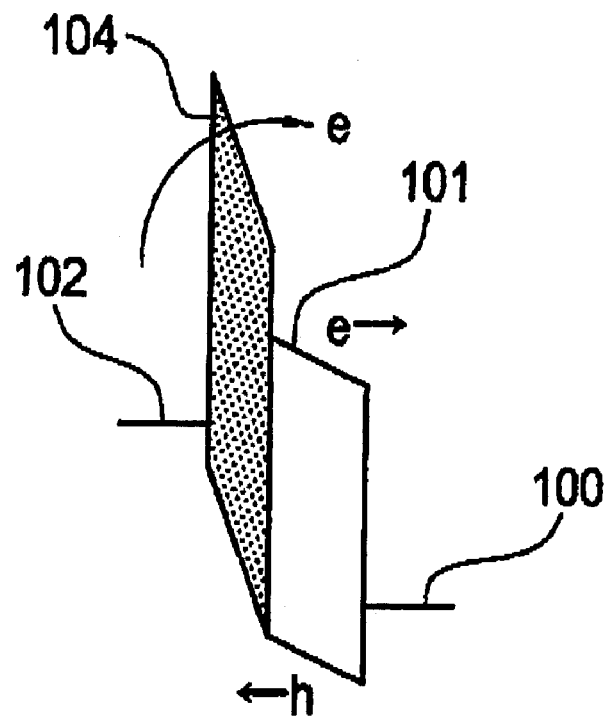

An energy diaphragm in a state that the relative dielectric constant of the electron blocking layer 104 is smaller than the relative dielectric constant of the photoelectric conversion layer 101 and that an external voltage is applied between the electrodes 100 and 102 is illustrated in FIG. 5B. In FIG. 5B, the same symbols as in FIG. 4 are given to energies of the respective configurative elements as illustrate in FIG. 4. When the relative dielectric constant of the electron blocking layer 104 is smaller than the relative dielectric constant of the photoelectric conversion layer 101, almost all of the external voltage is applied to the electron blocking layer 104, thereby forming the energy diaphragm as illustrated in FIG. 5B. As illustrated in FIG. 5B, when a large quantity of the voltage is applied to the electron blocking layer 104 and an electric field applied to the photoelectric conversion layer 101 becomes weak, the external quantum efficiency is lowered, leading to a lowering of the sensitivity. For that reason, in order to increase the external quantum efficiency, the external voltage is required to be large, and a consumed electric power increases.

For the purpose of increasing the external quantum efficiency, when the external voltage is made large, a stronger electric field is applied to the electron blocking layer 104 for that. Thus, the electron to be injected from the electrode 102 into the photoelectric conversion layer 101 increases, and it becomes difficult to sufficiently achieve the control of an electron injection current, an aspect of which should be originally expected for the electron blocking layer 104.

Then, the photoelectric conversion device as illustrated in FIG. 4 is characterized in that the relative dielectric constant of the electron blocking layer 104 is larger than the relative dielectric constant of the photoelectric conversion layer 101. An energy diaphragm in a state that the relative dielectric constant of the electron blocking layer 104 is larger than the relative dielectric constant of the photoelectric conversion layer 101 and that an external voltage is applied between the electrodes 100 and 102 is illustrated in FIG. 5A. In this way, since the major part of the external voltage is applied to the photoelectric conversion layer 101, even when the external voltage is not excessively increased, the external quantum efficiency can be increased.

Since the voltage to be applied to the electron blocking layer 104 can be also made small, it is possible to sufficiently obtain an effect for reducing an electron injection current, an aspect of which should be originally expected for the electron blocking layer 104, without causing an increase of the electron injected from the electrode 102 into the photoelectric conversion layer 101.

With respect to the relative dielectric constant of the electron blocking layer 104, a large relative dielectric constant is desirable. The relative dielectric constant is preferably 5 or more, and more preferably 10 or more. Since organic materials are generally small in the relative dielectric constant as compared with inorganic material, it is preferable that an inorganic material is used as the material of the electron blocking layer 104. Of inorganic materials, many inorganic oxides have a high relative dielectric constant and therefore, are more preferable. Examples of a material which is made of an inorganic oxide having a relative dielectric constant of 5 or more and which can be the material of the electron blocking layer 104 include NiO (relative dielectric constant: about 12). However, the material is require to be selected such that the relative dielectric constant of the electron blocking layer 104 is larger than the relative dielectric constant of the photoelectric conversion layer 101.

Incidentally, even when the relative dielectric constant of the electron blocking layer 104 is larger than the relative dielectric constant of the photoelectric conversion layer 101, if the thickness of the electron blocking layer 104 is too thick, the voltage which is applied to the electron blocking layer 104 becomes large. For that reason, taking into consideration the thickness of the electron blocking layer 104, it is more preferable that a value obtained by dividing the thickness of the photoelectric conversion layer 101 by the relative dielectric constant of the photoelectric conversion layer 101 is larger than a value obtained by dividing the thickness of the electron blocking layer 104 by the relative dielectric constant of the electron blocking layer 104.

The thickness of the electron blocking layer 104 is most preferably from 10 nm to 200 nm. This is because since a carrier generated in the photoelectric conversion layer 101 is required to be collected, when this thickness is too thick, though the blocking properties are improved, the external quantum efficiency is lowered.

It is preferable that a value obtained by dividing the voltage externally applied to the electrodes 100 and 102 by the sum of the thickness of the electron blocking layer 104 and the thickness of the photoelectric conversion layer 101 is in the range of from $1.0 \times 10^5$ V/cm to $1.0 \times 10^7$ V/cm.

In the photoelectric conversion device as illustrated in FIG. 4, since light is required to be made incident into the photoelectric conversion layer 101, it is preferable that the electrode 102 and the electron blocking layer 104 are transparent.

There may be the case where the photoelectric conversion device as illustrated in FIG. 4 is required to transmit light in a lower part of the electrode 100, too as described later. Accordingly, it is preferable that the electrode 100 is a transparent electrode, too.

Figure 6:
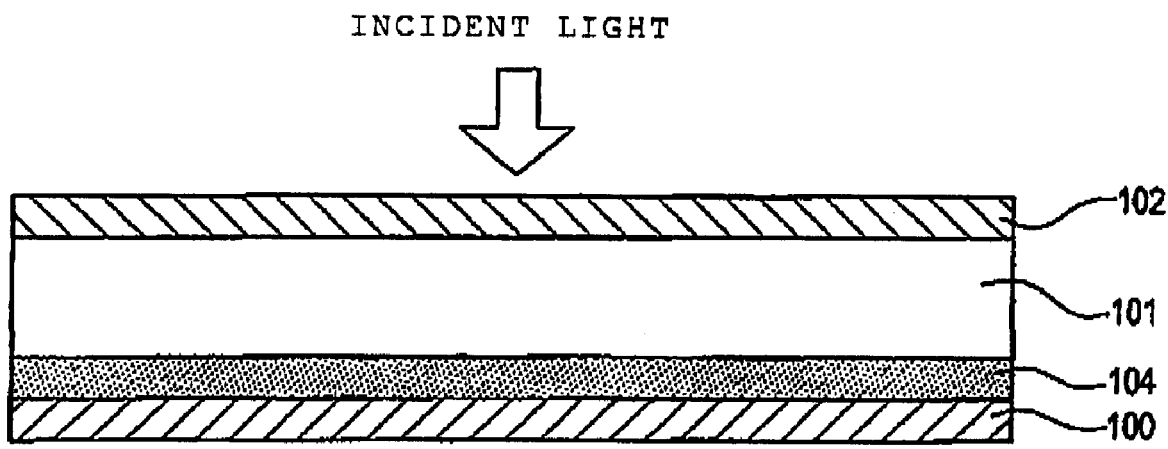
FIG. 6 is a view to show a modification example of the photoelectric conversion device of FIG. 4.

In the photoelectric conversion device as illustrated in FIG. 4, in the case where a voltage is applied to the electrodes 100 and 102 such that of charges generated in the photoelectric conversion layer 101 (namely, holes and electrons), the electrons are moved into the electrode 102, whereas the holes are moved into the electrode 100 (namely, the case where the electrode 102 works as an electrode for collecting electrons), the photoelectric conversion device may be configured to provide the electron blocking layer 104 between the electrode 100 and the photoelectric conversion layer 101 as illustrated in FIG. 6. In that case, the electron blocking layer 104 is required to be transparent.

Next, a photoelectric conversion device including a photoelectric conversion part containing an electron blocking layer and a hole blocking layer is described.

Figure 7:
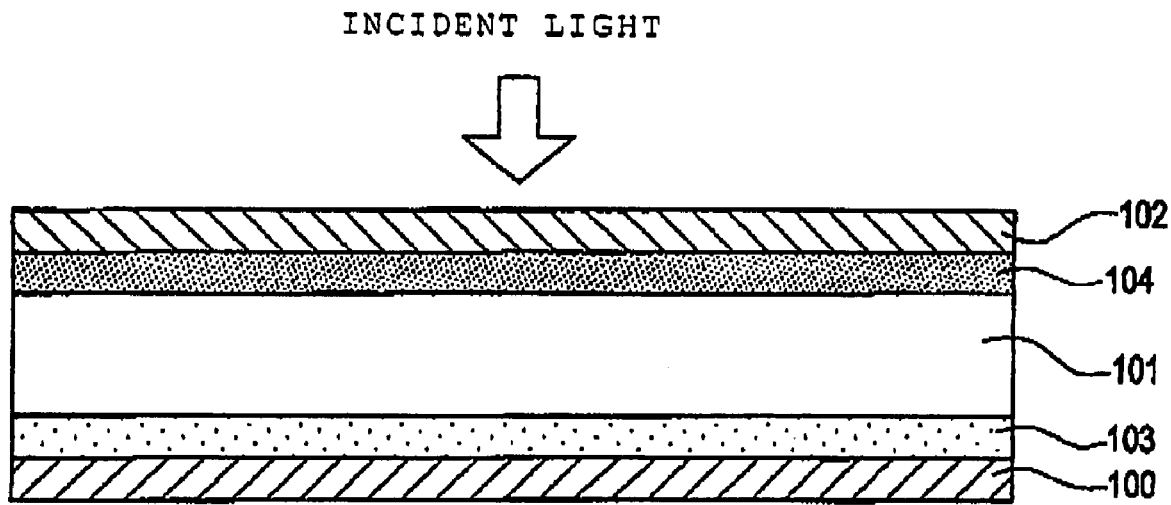
FIG. 7 is a schematic cross-sectional view to show an outline configuration of a photoelectric conversion device for explaining an embodiment of the invention.

FIG. 7 is a schematic cross-sectional view to show an outline configuration of a photoelectric conversion device for explaining an embodiment of the invention. In FIG. 7, the same configurations as in FIGS. 1 and 4 are given the same symbols.

A photoelectric conversion device as illustrated in FIG. 7 is configured to include a photoelectric conversion part containing a pair of an electrode 100 and an electrode 102 opposing to each other; a photoelectric conversion layer 101 formed between the electrode 100 and the electrode 102; a hole blocking layer 103 formed between the photoelectric conversion layer 101 and the electrode 100; and an electron blocking layer 104 formed between the photoelectric conversion layer 101 and the electrode 102. In the photoelectric conversion device as illustrated in FIG. 7, since light is made incident from an upper part of the electrode 102, the electrode 102 works as an electrode in the light incident side. In the photoelectric conversion device as illustrated in FIG. 7, a voltage is applied to the electrodes 100 and 102 such that of charges (namely, holes and electrons) generated in the photoelectric conversion layer 101, the holes are moved into the electrode 102, whereas the electrons are moved into the electrode 100 (namely, the electrode 100 works as an electrode for collecting electrons).

Figure 8A:
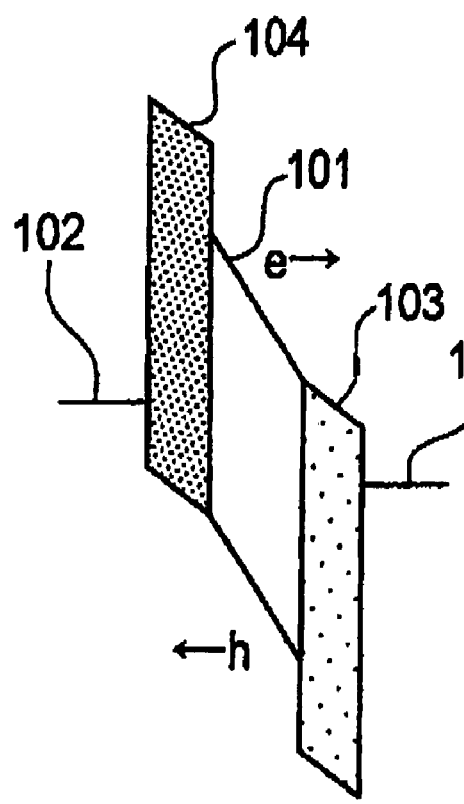
FIGS. 8A and 8B are each a view to show an energy diagram of the photoelectric conversion device of FIG. 7.
Figure 8B:
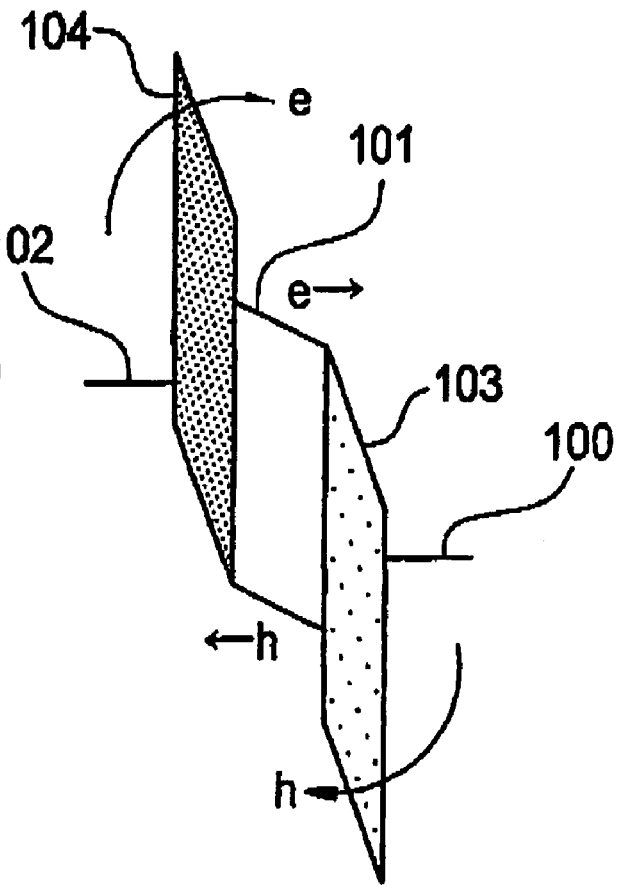

An energy diaphragm in a state that the relative dielectric constant of each of the electron blocking layer 104 and the hole blocking layer 103 is smaller than the relative dielectric constant of the photoelectric conversion layer 101 and that an external voltage is applied between the electrodes 100 and 102 is illustrated in FIG. 8B. As illustrated in FIG. 8B, when the relative dielectric constant of each of the electron blocking layer 104 and the hole blocking layer 103 is smaller than the relative dielectric constant of the photoelectric conversion layer 101, almost all of the external voltage is applied to the hole blocking layer 103 and the electron blocking layer 104, thereby causing problems such as a lowering of the external quantum efficiency, an increase of the consumed electric power and a reduction of the blocking effect as described previously.

Then, the photoelectric conversion device as illustrated in FIG. 7 is characterized in that the relative dielectric constant of each of the hole blocking layer 103 and the electron blocking layer 104 is larger than the relative dielectric constant of the photoelectric conversion layer 101. An energy diaphragm in a state that the relative dielectric constant of each of the hole blocking layer 103 and the electron blocking layer 104 is larger than the relative dielectric constant of the photoelectric conversion layer 101 and that an external voltage is applied between the electrodes 100 and 102 is illustrated in FIG. 8A. In this way, since the major part of the external voltage is applied to the photoelectric conversion layer 101, even when the external voltage is not excessively increased, the external quantum efficiency can be increased.

Since the electric field to be applied to each of the hole blocking layer 103 and the electron blocking layer 104 can be also made small, it is possible to sufficiently obtain an effect for reducing a charge injection current, an aspect of which should be originally expected for each of the hole blocking layer 103 and the electron blocking layer 104, without causing an increase of the electron injected from the electrode 102 into the photoelectric conversion layer 101.

Incidentally, even when the relative dielectric constant of each of the hole blocking layer 103 and the electron blocking layer 104 is larger than the relative dielectric constant of the photoelectric conversion layer 101, if each of the thickness of the hole blocking layer 103 and the thickness of the electron blocking layer 104 is too thick, the voltage which is applied to each of the hole blocking layer 103 and the electron blocking layer 104 becomes large. For that reason, taking into consideration the thickness of the hole blocking layer 103 and the thickness of the electron blocking layer 104, it is more preferable that a value obtained by dividing the thickness of the photoelectric conversion layer 101 by the relative dielectric constant of the photoelectric conversion layer 101 is larger than the sum of a value obtained by dividing the thickness of the hole blocking layer 103 by the relative dielectric constant of the hole blocking layer 103 and a value obtained by dividing the thickness of the electron blocking layer 104 by the relative dielectric constant of the electron blocking layer 104.

It is preferable that a value obtained by dividing the voltage externally applied to the electrodes 100 and 102 by the sum of the thickness of the hole blocking layer 103, the thickness of the electron blocking layer 104 and the thickness of the photoelectric conversion layer 101 is in the range of from $1.0 \times 10^5$ V/cm to $1.0 \times 10^7$ V/cm.

Figure 9:
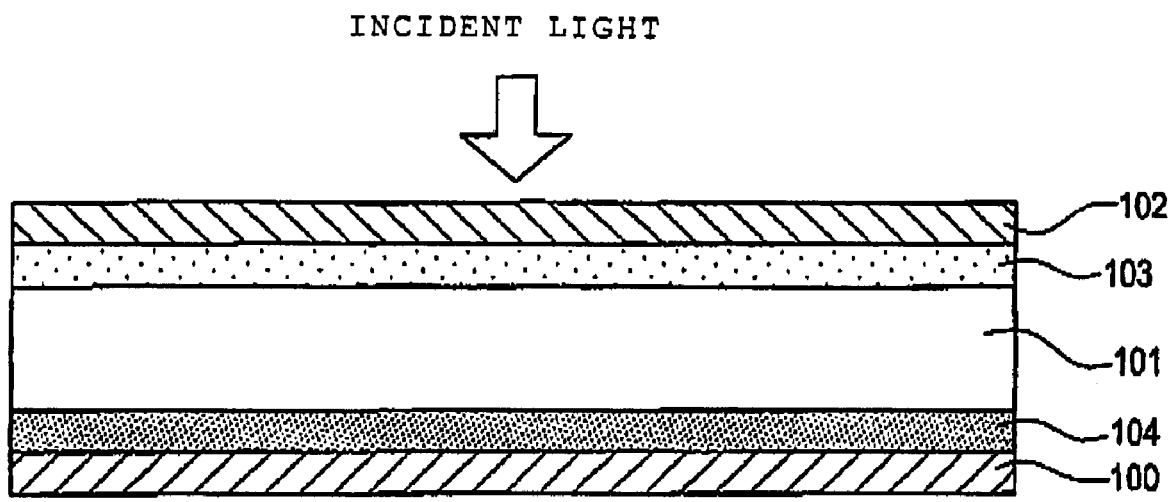
FIG. 9 is a view to show a modification example of the photoelectric conversion device of FIG. 7.

In the photoelectric conversion device as illustrated in FIG. 7, in the case where a voltage is applied to the electrodes 100 and 102 such that of charges generated in the photoelectric conversion layer 101 (namely, holes and electrons), the electrons are moved into the electrode 102, whereas the holes are moved into the electrode 100 (namely, the case where the electrode 102 works as an electrode for collecting electrons), the photoelectric conversion device may be configured to provide the electron blocking layer 104 between the electrode 100 and the photoelectric conversion layer 101 and to provide the hole blocking layer 103 between the electrode 102 and the photoelectric conversion layer 101 as illustrated in FIG. 9.

Configuration examples of a solid-state imaging device using a photoelectric conversion device having the configuration as illustrated in FIG. 9 as the foregoing photoelectric conversion device are hereunder described.

FIRST CONFIGURATION EXAMPLE

Figure 10:
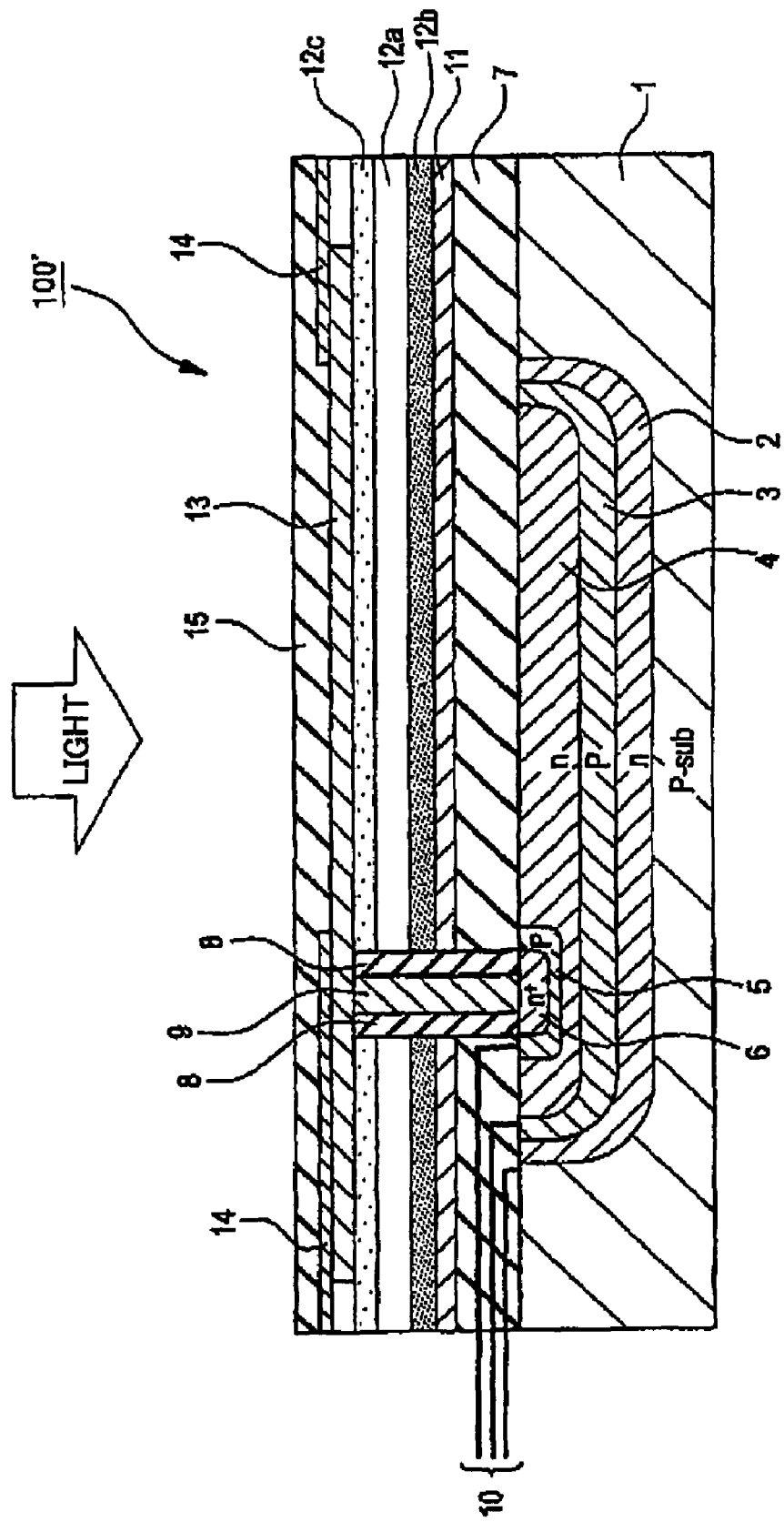
FIG. 10 is a schematic cross-sectional view of a portion of one pixel of a solid-state imaging device using a photoelectric conversion device of the configuration as illustrated in FIG. 9 and is a view to show a first configuration example.

FIG. 10 is a schematic cross-sectional view of a portion of one pixel of a solid-state imaging device using a photoelectric conversion device of the configuration as illustrated in FIG. 9 and is a view to show a first configuration example. In this solid-state imaging device 100', the one pixel as illustrated in FIG. 10 is disposed in a plural number in an array state on the same plane, and one pixel data of image data can be produced by a signal as obtained from this one pixel.

One pixel of the solid-state imaging device as illustrated in FIG. 10 is configured to include a photoelectric conversion part containing a p-type silicon substrate 1; a transparent dielectric layer 7 formed on the p-type silicon substrate 1; a first electron layer 11 formed on the dielectric layer 7; an electron blocking layer 12b formed on the first electrode layer 11; a photoelectric conversion layer 12a formed on the electron blocking layer 12b; a hole blocking layer 12c formed on the photoelectric conversion layer 12a; and a second electrode layer 13 formed on the hole blocking layer 12c. A light-shielding layer 14 provided with an opening is formed on the photoelectric conversion part. Furthermore, a transparent dielectric layer 15 is formed on the light-shielding layer 14 and the second electrode layer 13.

The first electrode layer 11 serves the same function as in the electrode 100 as illustrated in FIG. 9; the electron blocking layer 12b serves the same function as in the electron blocking layer 104 as illustrated in FIG. 9; the photoelectric conversion layer 12a serves the same function as in the photoelectric conversion layer 101 as illustrated in FIG. 9; the hole blocking layer 12c serves the same function as in the hole blocking layer 103 as illustrated in FIG. 9; and the second electrode layer 13 serves the same function as in the electrode 102 as illustrated in FIG. 9. Each of the first electrode layer 11, the electron blocking layer 12b, the hole blocking layer 12c and the second electrode layer 13 is transparent.

In the photoelectric conversion layer 12a, an exciton is generated corresponding to incident light from an upper part of the second electrode layer 13; the exciton is dissociated to generate charges including electrons and holes; and these charges are separately collected from the first electrode layer and the second electrode layer. The electrons and the holes are collected in larger amounts in the vicinity of the second electrode layer 13 in the light incident side than those in the vicinity of the first electrode layer 11. As one example of a material of such a photoelectric conversion layer, there are enumerated organic materials. In the configuration as illustrated in FIG. 10, a material capable of absorbing green light to generate electrons and holes corresponding thereto is used for the photoelectric conversion layer 12a. Since the photoelectric conversion layer 12a can be commonly used in all pixels, it may be a layer of a single-sheet configuration and is not required to be separated for every pixel.

An organic material which constitutes the photoelectric conversion layer 12a is able to absorb light, thereby achieving photoelectric conversion. Usually, it is able to absorb a part of visible light (light having a wavelength region of from 420 nm to 660 nm) and preferably has an absorptance of a peak wavelength in the subject wavelength region of 50% or more.

The organic p-type semiconductor (compound) is an organic semiconductor (compound) having donor properties and refers to an organic compound which is mainly represented by a hole transporting organic compound and which has properties such that it is liable to donate an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transporting organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene deriveatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

Next, the metal complex compound will be described. The metal complex compound is a metal complex having a ligand containing at least one of a nitrogen atom, an oxygen atom and a sulfur atom as coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), a heteroaryloxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio) a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, a heteroaryloxy ligand, or a siloxy ligand; and further preferably a nitrogen-containing heterocyclic ligand, an aryloxy ligand, or a siloxy ligand.

The case where the photoelectric conversion layer 12a contains a photoelectric conversion layer having a p-type semiconductor layer and an n-type semiconductor layer, with at least one of the p-type semiconductor layer and the n-type semiconductor layer being an organic semiconductor, and a bulk heterojunction structure layer containing the p-type semiconductor and the n-type semiconductor as an interlayer between these semiconductor layers is preferable. In such case, by containing a bulk heterojunction structure in the photoelectric conversion layer 12a, it is possible to compensate a drawback that the photoelectric conversion layer 12a has a short carrier diffusion length and improve the photoelectric conversion efficiency. Incidentally, the bulk heterojunction structure is described in detail in Japanese Patent Application No. 2004-080639 (JP-A-2005-303266).

Furthermore, the case where the photoelectric conversion layer 12a having a structure having two or more of a repeating structure (tandem structure) of a p-n junction layer formed of the p-type semiconductor layer and the n-type semiconductor layer is preferable; and the case where a thin layer made of a conducting material is inserted between the foregoing repeating structures is more preferable. The number of the repeating structure (tandem structure) of a p-n junction layer is not Limited. For enhancing the photoelectric conversion efficiency, the number of the repeating structure (tandem structure) of a p-n junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930 (JP-A-2005-303266).

Furthermore, the case where the photoelectric conversion layer 12a has a layer of a p-type semiconductor and a layer of an n-type semiconductor (preferably a mixed or dispersed (bulk heterojunction structure) layer) and contains an orientation-controlled organic compound in at least one of the p-type semiconductor and the n-type semiconductor is preferable; and the case where the photoelectric conversion layer 12a which contains an orientation-controlled (orientation controllable) organic compound in both the p-type semiconductor and the n-type semiconductor is more preferable. As this organic compound, an organic compound having a π-conjugated electron is preferably used. It is preferable that this π-electron plane is not vertical to a substrate (electrode substrate) but is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is only required that even a part of the layer of the orientation-controlled organic compound is contained over the whole of the photoelectric conversion layer 12a. A proportion of the orientation-controlled portion to the whole of the photoelectric conversion layer 12a is preferably 10% or more, more preferably 30% or more, further preferably 50% or more, still further preferably 70% or more, especially preferably 90% or more, and most preferably 100%. By controlling the orientation of the organic compound which is contained in the photoelectric conversion layer 12a, the foregoing state compensates a drawback that the photoelectric conversion layer 12a has a short carrier diffusion length, thereby improving the photoelectric conversion efficiency.

In the case where the orientation of an organic compound is controlled, it is more preferable that the heterojunction plane (for example, a p-n junction plane) is not in parallel to a substrate. In this case, it is preferable that the heterojunction plane is not in parallel to the substrate (electrode substrate) but is oriented at an angle close to verticality to the substrate as far as position. The angle to the substrate is preferably 10° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate). As described previously, it is only required that even a part of the layer of the heterojunction plane-controlled organic compound is contained over the whole of the photoelectric conversion layer 12a. A proportion of the orientation-controlled portion to the whole of the photoelectric conversion layer 12a is preferably 10% or more, more preferably 30% or more, further preferably 50% or more, still further preferably 70% or more, especially preferably 90% or more, and most preferably 100%. In such case, the area of the heterojunction plane in the photoelectric conversion layer 12a increases and the amount of a carrier such as an electron, a hole and a pair of an electron and a hole as formed on the interface increases so that it is possible to improve the photoelectric conversion efficiency. In the light of the above, in the photoelectric conversion layer in which the orientation of the organic compound on both the hetero junction plane and the π-electron plane is controlled, it is possible to improve especially the photoelectric conversion efficiency. These states are described in detail in Japanese Patent Application No. 2004-079931. From the standpoint of optical absorption, it is preferable that the thickness of the organic dye layer is thick as far as possible. However, taking into consideration a proportion which does not contribute to the charge separation, the thickness of the organic dye layer is preferably 30 nm or more and not more than 300 nm, more preferably 50 nm or more and not more than 250 nm, and especially preferably 80 nm or more and not more than 200 nm.

The photoelectric conversion layer 12a containing such an organic compound is fabricated by a dry deposition method or a wet deposition method. Specific examples of the dry deposition method include physical vapor phase epitaxy methods such as a vacuum vapor deposition method, a sputtering method, an ion plating method, and an MBE method; and CVD methods such as plasma polymerization. Examples of the wet deposition method include a casting method, a spin coating method, a dipping method, and an LB method.

In the case of using a high molecular weight compound in at least one of the p-type semiconductor (compound) and the n-type semiconductor (compound), it is preferable to be fabricated by a wet deposition method which is easy for the preparation. In the case of employing a dry deposition method such as vapor deposition, the use of a high molecular weight compound is difficult because of possible occurrence of decomposition. Accordingly, its oligomer can be preferably used as a replacement thereof. On the other hand, in the case of using a low molecular weight compound, a dry deposition method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to make it possible to achieve uniform vapor deposition, it is preferable that the vapor deposition is carried out while rotating the substrate. A high degree of vacuum is preferable. The vacuum vapor deposition is carried out at a degree of vacuum of not more than $10^{-4}$ Torr, preferably not more than $10^{-6}$ Torr, and especially preferably not more than $10^{-8}$ Torr. It is preferable that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator and an interferometer. In the case of vapor depositing two or more kinds of compounds at the same time, a dual-source vapor deposition method, a flash vapor deposition method and so on can be preferably employed.

In the photoelectric conversion layer 12a made of an organic material, in general, in the foregoing configuration, when light is made incident from an upper part of the second electrode layer 13, electrons and holes generated due to the light absorption are generated in large amounts in the vicinity of the second electrode layer 13, whereas they are not so much generated in the vicinity of the first electrode layer 11. This is caused due to the matter that the major part of light in the vicinity of an absorption peak wavelength of this photoelectric conversion layer 12a is absorbed in the vicinity of the second electrode layer 13, and the light absorptance becomes low as it is far from the vicinity the second electrode layer 13. For that reason, unless the electrons or the holes generated in the vicinity of the second electrode layer 13 is efficiently moved into the silicon substrate, the photoelectric conversion efficiency is lowered, resulting in a lowering of the sensitivity of the device. Also, since signals due to the light wavelength strongly absorbed in the vicinity of the second electrode layer 13 are reduced, there is consequently brought so-called broadening that a width of the spectral sensitivity is broadened.

In the photoelectric conversion layer 12a made of an organic material, in general, a mobility of the electron is smaller than a mobility of the hole. In addition, it is known that the mobility of the electron in the photoelectric conversion layer 12a made of an organic material is liable to be influenced by oxygen so that when the photoelectric conversion layer 12a is exposed to the air, the mobility of the electron is further lowered. For that reason, in the case where it is intended to move the electron into the silicon substrate 1, when a movement distance of the electrons generated in the vicinity of the second electrode layer 13 within the photoelectric conversion layer 12a is long, a part of the electrons causes deactivation or the like during the movement thereof and is not collected by the electrode layer. As a result, the sensitivity is lowered, and the spectral sensitivity is broadened.

In order to prevent the lowering of the sensitivity and the broadening of the spectral sensitivity, it is effective to efficiently move the electrons or the holes generated in the vicinity of the second electrode layer 13 into the silicon substrate 1. For realizing this, how to handle the electrons or the holes generated within the photoelectric conversion layer 12a is a problem.

In the solid-state imaging device 100', a voltage is applied between the first electrode layer 11 and the second electrode layer 13 such that the electrons generated in the photoelectric conversion layer 12a is moved into the second electrode layer 13, whereas the holes generated in the photoelectric conversion layer 12a is moved into the first electrode layer 11. As described previously, it is better that the electrons generated in the photoelectric conversion layer 12a is not moved at a long distance as far as possible. For that reason, by collecting the electrons in the second electrode layer 13 which is an electrode in the light incident side, the movement distance of the electron can be shortened, and the external quantum efficiency is increased. Also, it becomes possible to make the improvement of the sensitivity and the spectral sensitivity sharp.

An n-type semiconductor region (hereinafter referred to as "n region") 4, a p-type semiconductor region (hereinafter referred to as "p region") 3, and an n region 2 are formed in this order from the shallow side within the p-type silicon substrate 1. In a surface part of the portion which is light shielded by the light-shielding layer 14 of the n region 4, a high-density n region (hereinafter referred to as "n+ region") 6 is formed, and the periphery of the n+ region 6 is surrounded by a p region 5.

The depth of a p-n junction between the n region 4 and the p region 3 from the surface of the p-type silicon substrate 1 is a depth for absorbing blue light (about 0.2 µm). Accordingly, the n region 4 and the p region 3 absorb blue light and generate electrons corresponding thereto, thereby forming a photodiode (B photodiode) for storing the electrons. The electrons generated in the B photodiode is stored in the n region 4.

The depth of a p-n junction between the n region 2 and the p-type silicon substrate 1 from the surface of the p-type silicon substrate 1 is a depth for absorbing red light (about 2 µm). Accordingly, the n region 2 and the p-type silicon substrate 1 absorb red light and generate electrons corresponding thereto, thereby forming a photodiode (R photodiode) for storing the electrons. The electrons generated in the R photodiode is stored in the n region 2.

The n+ region 6 is electrically connected to the second electrode layer 13 via a connecting part 9 formed in an opening which is opened in the dielectric layer 7, the first electrode layer 11, the electron blocking layer 12b, the photoelectric conversion layer 12a and the hole blocking layer 12c and made of a metal such as aluminum and tungsten and stores the electrons collected in the second electrode layer 13 via the connecting part 9. The connecting part 9 is electrically insulated from other parts than the second electrode layer 13 and the n+ region 6 by a dielectric layer B.

The electron stored in the n region 2 is converted into a signal corresponding to the amount of a charge thereof by an MOS circuit (not illustrated) which is made of an n-channel MOS transistor formed within the p-type silicon substrate 1; the electron stored in the n region 4 is converted into a signal corresponding to the amount of a charge thereof by an MOS circuit (not illustrated) which is made of an n-channel MOS transistor formed within the p region 3; and the electron stored in the n+ region 6 is converted into a signal corresponding to the amount of a charge thereof by an MOS circuit (not illustrated) which is made of an n-channel MOS transistor formed within the p region 5, which is then outputted into the outside of the solid-state imaging device 100, These MOS circuits configure a signal read-out part as set forth in the appended claims. Each of the MOS circuits is connected to a non-illustrated signal read-out pad by a wiring 10. Incidentally, an extractor electrode is provided in each of the n region 2 and the n region 4, and when a prescribed reset potential is applied, each of the regions is depleted, and the volume of each of the p-n junction parts becomes an infinitely small value. In this way, it is possible to make the volume generated on the junction face extremely small.

According to such a configuration, G light can be photoelectrically converted by the photoelectric conversion layer 12a, and B light and R light can be photoelectrically converted by the B photodiode and the R photodiode in the p-type silicon substrate 1, respectively. Furthermore, since the G light is first absorbed in the upper part, the color separation between the B and G lights and between the G and R lights is excellent. This is a greatly excellent point as compared with a solid-state imaging device of a type in which three PDs are stacked within a silicon substrate and all of the BGR lights are separated within the silicon substrate. In the following description, portions for carrying out the photoelectric conversion, each of which is made of an inorganic material formed within the p-type silicon substrate 1 of the solid-state imaging device 100' (B photodiode and R photodiode), are each referred to as "inorganic layer", too.

Incidentally, it is also possible to form an inorganic photoelectric conversion part made of an inorganic material, which is able to absorb light which has transmitted through the photoelectric conversion layer 12a, generating a charge corresponding to the subject light and storing the charge is provided between the p-type silicon substrate 1 and the first electrode 11 (for example, between the dielectric layer 7 and the p-type silicon substrate 1). In this case, it is only required that an MOS circuit for reading out a signal corresponding to the charge stored in a charge storage region of this inorganic photoelectric conversion part is provided within the p-type silicon substrate 1 and that the wiring 10 is connected to this MOS circuit, too.

The first electrode layer 11 has a function to discharge the hole which has been generated in the photoelectric conversion layer 12a and moved. The first electrode layer 11 can be commonly used in all pixels. For that reason, in the solid-state imaging device 100', the first electrode layer 11 is a layer of a single-sheet configuration which is common in all pixels. As a material of the first electrode layer 11, any one of ITO, IZO, $ZnO_2$, $SnO_2$, $TiO_2$, FTO, Al, Ag, and Au can be preferably used.

The second electrode layer 13 serves a role for collecting the electrons which have been generated in the photoelectric conversion layer 12a and moved. The second electrode layer 13 is separated for every pixel, whereby image data can be produced. As a material of the second electrode layer 13, any one of ITO, IZO, $ZnO_2$, $SnO_2$, $TiO_2$, FTO, Al, Ag, and Au can be preferably used.

With respect to the inorganic layer, p-n junction or pin junction of crystalline silicon, amorphous silicon, or a compound semiconductor such as GaAs is generally employed. In this case, since the color separation is carried out with a light penetration depth of silicon, a spectrum range to be detected in each of the stacked light receiving parts becomes broad. However, by using the photoelectric conversion layer 12a as the upper layer as illustrated in FIG. 10, namely by detecting the light which has transmitted through the photoelectric conversion layer 12a in the depth direction of silicon, the color separation is remarkably improved. In particular, when G light is detected by the photoelectric conversion layer 12a as illustrated in FIG. 10, since the light which has transmitted through the photoelectric conversion layer 12a is B light and R light, only BR lights are subjective to separation of light in the depth direction in silicon so that the color separation is improved. Even in the case where the photoelectric conversion layer 12a detects the B light or the R light, by properly selecting the depth of the p-n junction of silicon, the color separation is remarkably improved.

With respect to the configuration of the inorganic layer, npn junction or pnpn junction from the incident side of light is preferable. In particular, the pnpn junction is more preferable because by providing a p layer on the surface and increasing a potential of the surface, it is possible to trap a hole generated in the vicinity of the surface and a dark current, thereby reducing the dark current.

Incidentally, while the configuration in which one photoelectric conversion part having the configuration as illustrated in FIG. 9 is stacked in the upper part of the n-type silicon substrate 1 is illustrated in FIG. 10, it is also possible to employ a configuration in which the photoelectric conversion part having the configuration as illustrated in FIG. 9 is stacked in a plural number in the upper part of the p-type silicon substrate 1. The configuration in which the photoelectric conversion part having the configuration as illustrated in FIG. 9 is stacked in a plural number will be described in a third configuration example as described later. In such case, the light to be detected in the inorganic layer may be a single color, and preferred color separation can be achieved. Furthermore, in the case where it is intended to detect lights of four colors in one pixel of the solid-state imaging device 100', for example, there may be thought a configuration in which one color is detected in one photoelectric conversion part and the remaining three colors are detected in the inorganic layer; a configuration in which two photoelectric conversion parts are stacked, thereby detecting two colors therein and the remaining two colors are detected in the inorganic layer; and a configuration in which three photoelectric conversion parts are stacked, thereby detecting three colors therein and the remaining one color is detected in the inorganic layer. Furthermore, the solid-state imaging device 100' may be configured to detect only one color in one pixel. This case is corresponding to the configuration as illustrated in FIG. 10, except that the n region 2, the p region 3 and the n region 4 are eliminated.

The inorganic layer will be hereunder described in more detail. Preferred examples of the configuration of the inorganic layer include light receiving devices of a photoconductive type, a p-n junction type, a shotkey junction type, a PIN junction type or an MSM (metal-semiconductor-metal) type; and light receiving devices of a phototransistor type. In particular, as illustrated in FIG. 10, it is preferred to use a light receiving device in which a plural number of a first conducting type region and a second conducting type region which is a reversed conducting type to the first conducting type are alternately stacked within a single semiconductor substrate and each of the junction planes of the first conducting type and second conducting type regions is formed in a depth suitable for subjecting mainly plural lights of a different wavelength region to photoelectric conversion. The single semiconductor substrate is preferably single crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor which is adjusted so as to have a maximum absorption value within a blue wavelength range by properly, changing the In-containing composition. That is, the composition becomes $In_xGa_{1-x}N$ ($0 \leq x < 1$). Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving part similar to the InGaN based semiconductor. Furthermore, InAlP or InGaAlP which is lattice matched with a GaAs substrate can also be used.

The inorganic semiconductor may be of a buried structure. The "buried structure" as referred to herein refers to a construction in which the both ends of a short wavelength light receiving part are covered by a semiconductor different from the short wavelength light receiving part. The semiconductor for covering the both ends is preferably a semiconductor having a band gap wavelength shorter than or equal to a band gap wavelength of the short wavelength light receiving part.

SECOND CONFIGURATION EXAMPLE

In a second configuration example, the inorganic layer having the configuration as illustrated in FIG. 10 which is described in the first configuration example is prepared in such a manner that two photodiodes are not stacked within the p-type silicon substrate but that two photodiodes are arranged in a direction vertical to an incident direction of the incident light, thereby detecting lights of two colors within the p-type silicon substrate.

Figure 11:
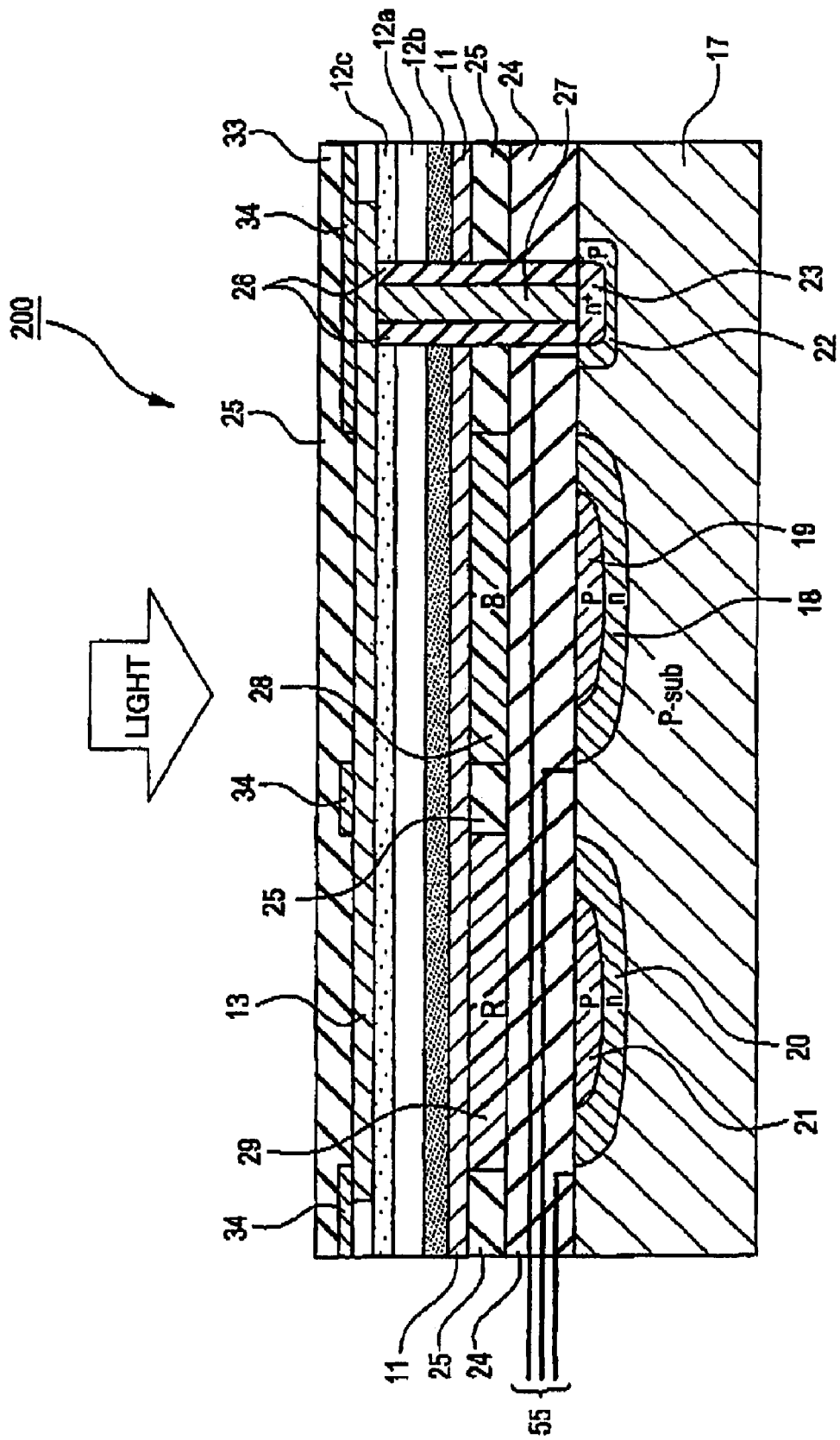
FIG. 11 is a schematic cross-sectional view of a portion of one pixel of a solid-state imaging device using a photoelectric conversion device of the configuration as illustrated in FIG. 9 and is a view to show a second configuration example.

FIG. 11 is a schematic cross-sectional view of a portion of one pixel of a solid-state imaging device using a photoelectric conversion device of the configuration as illustrated in FIG. 9 and is a view to show a second configuration example. In FIG. 11, the same configurations as in FIG. 10 are given the same symbols.

One pixel of a solid-state imaging device 200 as illustrated in FIG. 11 is configured to include a photoelectric conversion part containing a p-type silicon substrate 17; a first electrode layer 11 formed on the upper side of the p-type silicon substrate 17, an electron blocking layer 12b formed on the first electrode layer 11; a photoelectric conversion layer 12a formed on the electron blocking layer 12b; a hole blocking layer 12c formed on the photoelectric conversion layer 12a; and a second electrode layer 13 formed on the hole blocking layer 12. A light-shielding layer 34 provided with an opening is formed on the photoelectric conversion part, and a light-receiving region of a photoelectric conversion layer 31a is restricted by this light-shielding layer 34. Furthermore, a transparent dielectric layer 33 is formed on the light-shielding layer 34.

A photodiode which is made of a p region 19 and an n region 18 and a photodiode which is made of a p region 21 and an n region 20 are formed side by side on the surface of the p-type silicon substrate 17 in a lower part of the opening of the light-shielding layer 34. An arbitrary direction on the surface of the p-type silicon substrate 17 is a direction vertical to an incident direction of the incident light.

A color filter 28 capable of transmitting B light therethrough via a transparent dielectric layer 24 is formed on the upper side of the photodiode which is made of the p region 19 and the n region 18, and the first electrode layer 11 is formed on the upper side thereof. A color filter 29 capable of transmitting R light therethrough via the transparent dielectric layer 24 is formed on the upper side of the photodiode which is made of the p region 21 and the n region 20, and the first electrode layer 11 is formed thereon. The peripheries of the color filters 28 and 29 are covered by a transparent dielectric layer 25.

The photodiode which is made of the p region 19 and the n region 18 absorbs the B light which has transmitted through the color filter 28 to generate electrons corresponding thereto and stores the generated electron in the n region 18. The photodiode which is made of the p region 21 and the n region 20 absorbs the R light which has transmitted through the color filter 29 to generate electrons corresponding thereto and stores the generated electron in the n region 20.

In a portion which is light shielded by the light-shielding layer 34 on the surface of the p-type silicon substrate 17, an n+ region 23 is formed, and the periphery of the n+ region 23 is surrounded by a p region 22.

The n+ region 23 is electrically connected to the second electrode layer 13 via a connecting part 27 formed in an opening which is opened in the dielectric layers 24 and 25, the first electrode layer 11, the electron blocking layer 12b, the photoelectric conversion layer 12a and the hole blocking layer 12c and made of a metal such as aluminum and tungsten and stores the electrons collected in the second electrode layer 13 via the connecting part 27. The connecting part 27 is electrically insulated from other parts than the second electrode layer 13 and the n+ region 23 by a dielectric layer 26.

The electron stored in the n region 18 is converted into a signal corresponding to the amount of a charge thereof by an MOS circuit (not illustrated) which is made of an n-channel MOS transistor formed within the p-type silicon substrate 17; the electron stored in the n region 20 is converted into a signal corresponding to the amount of a charge thereof by an MOS circuit (not illustrated) which is made of an n-channel MOS transistor formed within the p-type silicon substrate 17; and the electron stored in the n+ region 23 is converted into a signal corresponding to the amount of a charge thereof by an MOS circuit (not illustrated) which is made of an n-channel MOS transistor formed within the p region 22, which is then outputted into the outside of the solid-state imaging device 200. These MOS circuits configure a signal read-out part as set forth in the appended claims. Each of the MOS circuits is connected to a non-illustrated signal read-out pad by a wiring 35.

Incidentally, the signal read-out part may be configured of CCD and an amplifier but not an MOS circuit. In other words, the signal read-out part may be configured such that the electrons stored in the n region 18, the n region 2G and the n+ region 23 are read out into a charge transfer channel formed within the p-type silicon substrate 17 and transferred into an amplifier, from which are then outputted signals corresponding to the electrons.

In this way, examples of the signal read-out part include CCD and CMOS structures. Of these, the CMOS structure is preferable in view of consumed electricity, high-speed read-out, pixel addition, partial read-out, and so on. Furthermore, in the case of CMOS, though any of an electron or a hole may be considered as a signal charge which can be treated, the electron is more excellent than the hole in view of high speed of signal read-out derived from a degree of charge transfer and a degree of perfection of process conditions in the manufacturing. Thus, it is preferable that the electrode for collecting an electron is connected to the n+ region.

Incidentally, in FIG. 11, the color separation between the R light and the B light is carried out by the color filters 28 and 29. However, the R light and the B light may be absorbed by the respective photodiodes without providing the color filters 28 and 29 by adjusting each of a depth of the p-n junction between the n region 20 and the p region 21 and a depth of the p-n junction between the n region 18 and the p region 19. In this case, it is also possible to form an inorganic photoelectric conversion part made of an organic material, which is able to absorb light which has transmitted through the photoelectric conversion layer 12a, generating a charge corresponding to the subject light and storing the charge is provided between the p-type silicon substrate 17 and the first electrode 11 (for example, between the dielectric layer 24 and the p-type silicon substrate 17). In this case, it is only required that an MOS circuit for reading out a signal corresponding to the charge stored in a charge storage region of this inorganic photoelectric conversion part is provided within the p-type silicon substrate 17 and that the wiring 35 is connected to this MOS circuit, too.

Furthermore, a configuration in which one photodiode is provided within the p-type silicon substrate 17 and plural photoelectric conversion parts are stacked in the upper part of the p-type silicon substrate 17 may be employed. In addition, a configuration in which plural photodiodes are provided within the p-type silicon substrate 17 and plural photoelectric conversion parts are stacked in the upper part of the p-type silicon substrate 17 may be employed. Moreover, in the case where it is not necessary to prepare a color image, a configuration in which one photodiode is provided within the p-type silicon substrate 17 and only one photoelectric conversion part is stacked thereon may be employed.

THIRD CONFIGURATION EXAMPLE

A third configuration example is concerned with a configuration in which the inorganic layer having the configuration as illustrated in FIG. 10 which is described in the first configuration example is not provided and the photoelectric conversion layer having the configuration as illustrated in FIG. 9 is stacked in a plural number (three in this instance) on the upper side of the silicon substrate.

Figure 12:
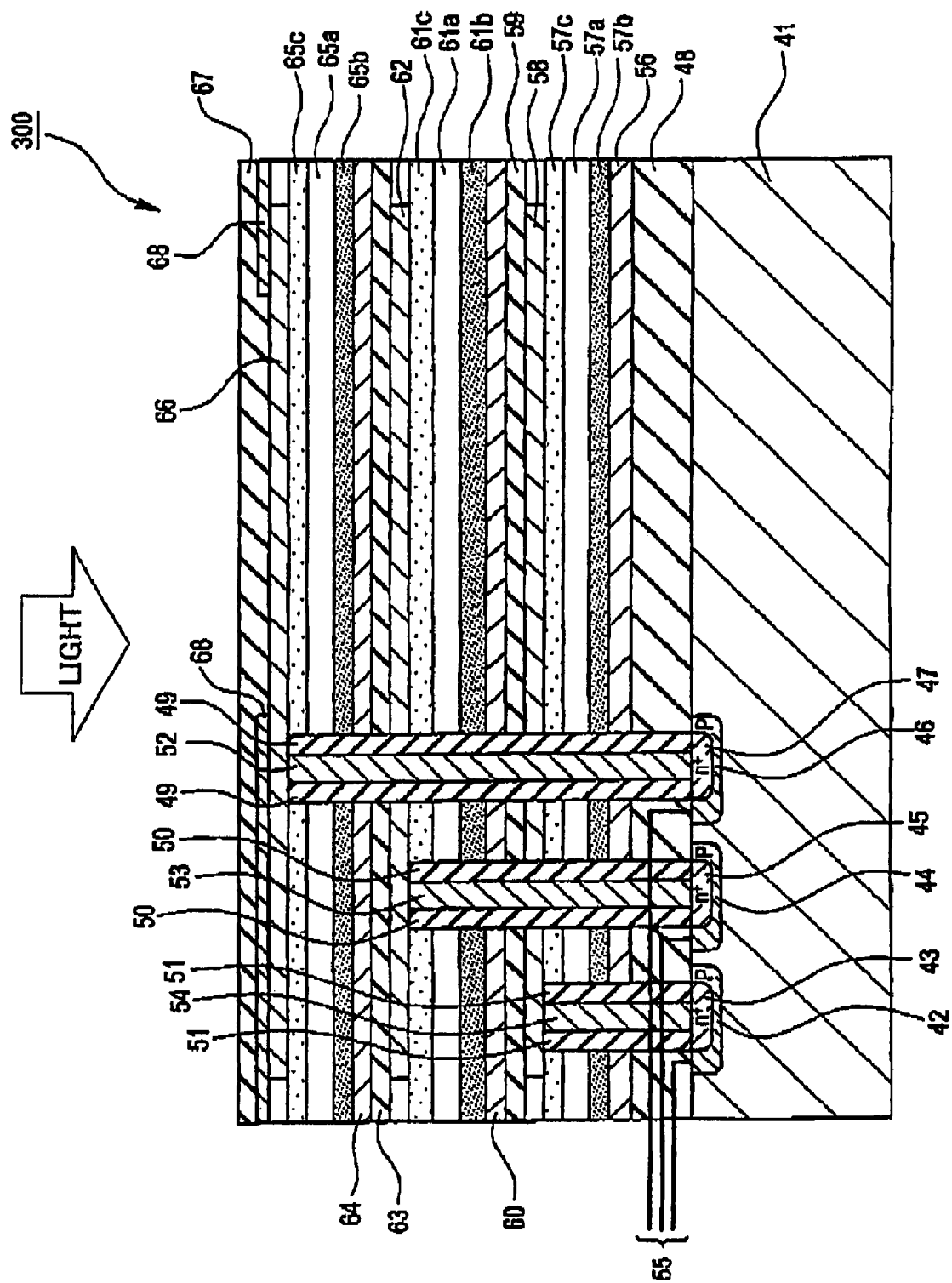
FIG. 12 is a schematic cross-sectional view of a portion of one pixel of a solid-state imaging device using a photoelectric conversion device of the configuration as illustrated in FIG. 9 and is a view to show a third configuration example.

FIG. 12 is a schematic cross-sectional view of a portion of one pixel of a solid-state imaging device using the photoelectric conversion device having the configuration as illustrated in FIG. 9 and is a view to show a third configuration example.

A solid-state imaging device 300 as illustrated in FIG. 12 is configured such that an R photoelectric conversion part including a first electrode layer 56, an electron blocking layer 57b formed on the first electrode layer 56, a photoelectric conversion layer 57a formed on the electron blocking layer 57b, a hole blocking layer 57c formed on the photoelectric conversion layer 57a and a second electrode layer 58 formed on the hole blocking layer 57c; a B photoelectric conversion part including a first electrode layer 60, an electron blocking layer 61b formed on the first electrode layer 60, a photoelectric conversion layer 61a formed on the electron blocking layer 61b, a hole blocking layer 61c formed on the photoelectric conversion layer 61a and a second electrode layer 62 formed on the hole blocking layer 61c; and a G photoelectric conversion part including a first electrode layer 64, an electron blocking layer 65b formed on the first electrode layer 64, a photoelectric conversion layer 65a formed on the electron blocking layer 65b, a hole blocking layer 65c formed on the photoelectric conversion layer 65a and a second electrode layer 66 formed on the hole blocking layer 65c are stacked in this order on the upper side of a silicon substrate 41 in a state that the first electrode layer to be contained in each of the photoelectric conversion parts is faced in the side of the silicon substrate 41.

A transparent dielectric layer 48 is formed on the silicon substrate 41; the R photoelectric conversion part is formed thereon; a transparent dielectric layer 59 is formed thereon; the B photoelectric conversion part is formed thereon; a transparent dielectric layer 63 is formed thereon; the G photoelectric conversion part is formed thereon; a light-shielding layer 68 provided with an opening is formed thereon; and a transparent dielectric layer 67 is formed thereon.

The first electrode layer 64, the electron blocking layer 65b, the photoelectric conversion layer 65a, the hole blocking layer 65c and the second electrode layer 66 which are included in the G photoelectric conversion part have configurations the same as those in the first electrode layer 11, the electron blocking layer 12b, the photoelectric conversion layer 12a, the hole blocking layer 12c and the second electrode layer 13 as illustrated in FIG. 10.

The first electrode layer 60, the electron blocking layer 61b, the photoelectric conversion layer 61a, the hole blocking layer 61c and the second electrode layer 62 which are included in the B photoelectric conversion part have configurations the same as those in the first electrode layer 11, the electron blocking layer 12b, the photoelectric conversion layer 12a, the hole blocking layer 12c and the second electrode layer 13 as illustrated in FIG. 10. However, a material capable of absorbing blue light to generate electrons and holes corresponding thereto is used in the photoelectric conversion layer 61a.

The first electrode layer 56, the electron blocking layer 57b, the photoelectric conversion layer 57a, the hole blocking layer 57c and the second electrode layer 58 which are included in the R photoelectric conversion part have configurations the same as those in the first electrode layer 11, the electron blocking layer 12b, the photoelectric conversion layer 12a, the hole blocking layer 12c and the second electrode layer 13 as illustrated in FIG. 10. However, a material capable of absorbing red light to generate electrons and holes corresponding thereto is used in the photoelectric conversion layer 57a.

In a portion which is light shielded by the light-shielding layer 68 on the surface of the silicon substrate 41, n+ regions 43, 45 and 47 are formed, and the peripheries of these n+ regions are surrounded by p regions 42, 44 and 46, respectively.

The n+ region 43 is electrically connected to the second electrode layer 58 via a connecting part 54 formed in an opening which is opened in the dielectric layer 48, the first electrode layer 56, the electron blocking layer 57b, the photoelectric conversion layer 57a and the hole blocking layer 57c and made of a metal such as aluminum and tungsten and stores the electrons collected in the second electrode layer 58 via the connecting part 54. The connecting part 54 is electrically insulated from other parts than the second electrode layer 58 and the n+ region 43 by a dielectric layer 51.

The n+ region 45 is electrically connected to the second electrode layer 62 via a connecting part 53 formed in an opening which is opened in the dielectric layer 48, the R photoelectric conversion part, the dielectric layer 59, the first electrode layer 60, the electron blocking layer 61b, the photoelectric conversion layer 61a and the hole blocking layer 61c and made of a metal such as aluminum and tungsten and stores the electrons collected in the second electrode layer 62 via the connecting part 53. The connecting part 53 is electrically insulated from other parts than the second electrode layer 62 and the n+ region 45 by a dielectric layer 50.

The n+ region 47 is electrically connected to the second electrode layer 66 via a connecting part 52 formed in an opening which is opened in the dielectric layer 48, the R photoelectric conversion part, the dielectric layer 59, the B photoelectric conversion part, the dielectric layer 63, the first electrode layer 64, the electron blocking layer 65b, the photoelectric conversion layer 65a and the hole blocking layer 65c and made of a metal such as aluminum and tungsten and stores the electrons collected in the second electrode layer 66 via the connecting part 52. The connecting part 52 is electrically insulated from other parts than the second electrode layer 66 and the n+ region 47 by a dielectric layer 49.

The electron stored in the n+ region 43 is converted into a signal corresponding to the amount of a charge thereof by an MOS circuit (not illustrated) which is made of an n-channel MOS transistor formed within the p region 42; the electron stored in the n+ region 45 is converted into a signal corresponding to the amount of a charge thereof by an MOS circuit (not illustrated) which is made of an n-channel MOS transistor formed within the p region 44; and the electron stored in the n+ region 47 is converted into a signal corresponding to the amount of a charge thereof by an MOS circuit (not illustrated) which is made of an n-channel MOS transistor formed within the p region 46, which is then outputted into the outside of the solid-state imaging device 300. These MOS circuits configure a signal read-out part as set forth in the appended claims. Each of the MOS circuits is connected to a non-illustrated signal read-out pad by a wiring 55. Incidentally, the signal read-out part may be configured of CCD and an amplifier but not an MOS circuit. In other words, the signal read-out part may be configured such that the electrons as stored in the n+ region 43, 45 and 47 are read out into a charge transfer channel formed within the silicon substrate 41 and transferred into an amplifier, from which are then outputted signals corresponding to the electrons.

Incidentally, it is also possible to form an inorganic photoelectric conversion part made of an inorganic material, which is able to absorb light which has transmitted through the photoelectric conversion layers 65a, 61a and 57a, generating a charge corresponding to the subject light and storing the charge between the silicon substrate 41 and the first electrode layer 56 (for example, between the dielectric layer 48 and the silicon substrate 41). In this case, it is only required that an MOS circuit for reading out a signal corresponding to the charge stored in a charge storage region of this inorganic photoelectric conversion part is provided within the silicon substrate 41 and that the wiring 55 is connected to this MOS circuit, too.

In this way, the configuration in which plural photoelectric conversion parts having the configuration as illustrated in FIG. 9 are stacked on a silicon substrate can be realized by the configuration as illustrated in FIG. 12.

In the foregoing description, the "photoelectric conversion layer capable of absorbing B light" as referred to herein means a photoelectric conversion layer which is able to absorb at least light of from 400 to 500 nm and preferably has an absorptance of a peak wavelength in the subject wavelength region of 50% or more. The "photoelectric conversion layer capable of absorbing G light" as referred to herein means a photoelectric conversion layer which is able to absorb at least light of from 500 to 600 nm and preferably has an absorptance of a peak wavelength in the subject wavelength region of 50% or more. The "photoelectric conversion layer capable of absorbing R light" as referred to herein means a photoelectric conversion layer which is able to absorb at least light of from 600 to 700 nm and preferably has an absorptance of a peak wavelength in the subject wavelength region of 50% or more.

In the case of the configurations as in the first configuration example and the third configuration example, patterns for detecting colors in the order of BGR, BRG, GBR, GRE, RBG and RGB from the upper layer can be thought. It is preferable that the uppermost layer is a G layer. Furthermore, in the case of the configuration as in the second configuration example, when the upper layer is an R layer, the lower layer can be a combination of a B layer and a G layer formed in the same planar state; when the upper layer is a B layer, the lower layer can be a combination of a G layer and an R layer formed in the same planar state; and when the upper layer is a G layer, the lower layer can be a combination of a B layer and an R layer formed in the same planar state. Of these, a configuration as illustrated in FIG. 11 in which the upper layer is a G layer and the lower layer is a combination of a B layer and an R layer formed in the same planar state is preferable.

Incidentally, in the first to third configuration examples, the photoelectric conversion part of the configuration as illustrated in FIG. 9 is used as the photoelectric conversion part to be provided in the upper part of the silicon substrate. However, as a matter of course, those of the configuration as illustrated in each of FIGS. 1, 5, 4, 6 and 7 can be used. According to the configurations as illustrated in FIGS. 7 and 9, since the electrons and the holes can be blocked, an effect for reducing a dark current is high. Also, in the case where the electrode in a side opposite to the light incident side works as an electrode for collecting electrodes as in the configurations as illustrated in FIGS. 1, 4 and 7, in FIG. 10, there may be taken a configuration such that the connecting part 9 is connected to the first electrode layer 11; in FIG. 11, there may be taken a configuration such that the connecting part 27 is connected to the first electrode layer 11; and in FIG. 12, there may be taken a configuration such that the connecting part 54 is connected to the first electrode layer 56, the connecting part 53 is connected to the first electrode layer 60, and the connecting part 52 is connected to the first electrode layer 64, respectively.

The solid-state imaging device explained in the present embodiment is configured such that the one pixel as illustrated in FIGS. 10 to 12 is disposed in a plural number in an array state on the same plane. Since color signals of RGB can be obtained by this one pixel, it can be thought that this one pixel is a photoelectric conversion device for converting RGB lights into electric signals. For that reason, it can be said that the solid-state imaging device explained in the present embodiment is configured such that a number of the photoelectric conversion device as illustrated in FIGS. 10 to 12 are disposed in an array state on the same plane.

EXAMPLES

The effects of the invention are demonstrated below with reference to the following Examples.

Comparative Example 1

A photoelectric conversion device having a configuration the same as in the photoelectric conversion device as illustrated in FIG. 1, except for not providing the hole blocking layer 103, was prepared (this photoelectric conversion device will be hereinafter referred to as "photoelectric conversion device A"). The photoelectric conversion device A was prepared by forming the ITO electrode 100 having a thickness of 200 nm on a glass substrate by an RF magnetron sputtering method; vacuum vapor depositing quinacridone (relative dielectric constant: about 3.9) on the electrode 100 to form the photoelectric conversion layer 101 having a thickness of 100 nm; and forming the ITO electrode 102 having a thickness of 10 nm on the photoelectric conversion layer 101 by an RF magnetron sputtering method. An external voltage of 1 V was applied to the photoelectric conversion device A, and electrons and holes were collected from the electrode 100 and the electrode 102, respectively. As a result, the dark current was about 10 μA/cm².

Comparative Example 2

A photoelectric conversion device having the configuration as illustrated in FIG. 1 was prepared (this photoelectric conversion device will be hereinafter referred to as "photoelectric conversion device B"). The photoelectric conversion device B was prepared by forming the ITO electrode 100 having a thickness of 200 nm by an RF magnetron sputtering method; vacuum vapor depositing an organic compound having a relative dielectric constant of 3.0 on the electrode 100 to form the hole blocking layer 103 having a thickness of 50 nm; vacuum vapor depositing quinacridone (relative dielectric constant: about 3.9) on the hole blocking layer 103 to form the photoelectric conversion layer 101 having a thickness of 100 nm; and forming the ITO electrode 102 having a thickness of 10 nm on the photoelectric conversion layer 101 by an RF magnetron sputtering method. An external voltage of 1.5 V was applied such that an average electric field strength to be applied to the photoelectric conversion layer 101 and the hole blocking layer 103 of the photoelectric conversion device B is equal to an average electric strength to be applied to the photoelectric conversion device A, and electrons and holes were collected from the electrode 100 and the electrode 102, respectively. As a result, the dark current was about 10 μA/cm². Also, the external quantum efficiency upon irradiation with light having a wavelength of 550 nm and a quality of light of 50 μW/cm² was 10%. Though the dark current was small as compared with Comparative Example 1, a sufficient value with respect to the external quantum efficiency was not obtained.

Example

A photoelectric conversion device C was prepared in the same configuration as in the photoelectric conversion device B, except for changing the organic compound in the hole blocking layer 103 of the photoelectric conversion device B to $CeO_2$ (relative dielectric constant: about 26) having a relative dielectric constant larger than that in the photoelectric conversion layer 101. However, $CeO_2$ was fabricated by an RF magnetron sputtering method. An external voltage of 1.5 V was applied, and electrons and holes were collected from the electrode 100 and the electrode 102, respectively. As a result, the dark current was about 5 μA/cm². Also, the external quantum efficiency upon irradiation with light having a wavelength of 550 nm and a quality of light of 50 μW/cm² was 15%. It is noted that the dark current is small and the external quantum efficiency increases as compared with Comparative Example 2.

In the light of the above, it is demonstrated that in the case of providing the hole blocking layer, by making a relative dielectric constant of the hole blocking layer larger than a relative dielectric constant of the photoelectric conversion layer, the external quantum efficiency is improved while suppressing the dark current. It can be said that the same effects are also obtainable in the case of providing the electron blocking layer or in the case of providing both the hole blocking layer and the electron blocking layer.

This application is based on Japanese Patent application JP 2006-59968, filed Mar. 6, 2006, and Japanese Patent application JP 2006-347565, filed Dec. 25, 2006, the entire contents of which are hereby incorporated by reference, the same as if set forth at length.

What is claimed is:

1. A photoelectric conversion device comprising a photoelectric conversion part including a pair of electrodes and a photoelectric conversion layer provided between the pair of electrodes, wherein
  the photoelectric conversion part further includes a first charge blocking layer for reducing an injection of a charge into the photoelectric conversion layer from one of the pair of electrodes when a voltage is applied between the pair of electrodes, the first charge blocking layer being provided between the one of the pair of electrodes and the photoelectric conversion layer; and
  the first charge blocking layer has a relative dielectric constant larger than a relative dielectric constant of the photoelectric conversion layer.

2. The photoelectric conversion device according to claim 1, wherein
  the photoelectric conversion part further includes a second charge blocking layer for reducing an injection of a charge into the photoelectric conversion layer from other of the pair of electrodes when a voltage is applied between the pair of electrodes, the second charge blocking layer being provided between the other of the pair of electrodes and the photoelectric conversion layer; and
  the second charge blocking layer has a relative dielectric constant larger than a relative dielectric constant of the photoelectric conversion layer.

3. The photoelectric conversion device according to claim 1, wherein a value obtained by dividing a thickness of the photoelectric conversion layer by the relative dielectric constant of the photoelectric conversion layer is larger than a value obtained by dividing a thickness of the first charge blocking layer by the relative dielectric constant of the first charge blocking layer.

4. The photoelectric conversion device according to claim 2, wherein a value obtained by dividing a thickness of the photoelectric conversion layer by the relative dielectric constant of the photoelectric conversion layer is larger than a sum of a value obtained by dividing a thickness of the first charge blocking layer by the relative dielectric constant of the first charge blocking layer and a value obtained by dividing a thickness of the second charge blocking layer by the relative dielectric constant of the second charge blocking layer.

5. The photoelectric conversion device according to claim 1, wherein the first charge blocking layer has a thickness of from 10 to 200 nm.

6. The photoelectric conversion device according to claim 1, wherein the first charge blocking layer has a relative dielectric constant of 5 or more.

7. The photoelectric conversion device according to claim 1, wherein the first charge blocking layer is transparent.

8. The photoelectric conversion device according to claim 1, wherein a value obtained by dividing a voltage externally applied between the pair of electrodes by a sum of a thickness of the first charge blocking layer and a thickness of the photoelectric conversion layer is from $1.0 \times 10^5$ V/cm to $1.0 \times 10^7$ V/cm.

9. The photoelectric conversion device according to claim 1, wherein the first charge blocking layer comprises an inorganic material.

10. The photoelectric conversion device according to claim 2, wherein the first charge blocking layer has a thickness of from 10 to 200 nm, and the second charge blocking layer has a thickness of from 10 to 200 nm.

11. The photoelectric conversion device according to claim 2, wherein the first charge blocking layer has a relative dielectric constant of 5 or more, and the second charge blocking layer has a relative dielectric constant of 5 or more.

12. The photoelectric conversion device according to claim 2, wherein each of the first charge blocking layer and the second charge blocking layer is transparent.

13. The photoelectric conversion device according to claim 2, wherein a value obtained by dividing a voltage externally applied between the pair of electrodes by a sum of a thickness of the first charge blocking layer, a thickness of the second charge blocking layer and a thickness of the photoelectric conversion layer is from $1.0 \times 10^5$ V/cm to $1.0 \times 10^7$ V/cm.

14. The photoelectric conversion device according to claim 2, wherein the first charge blocking layer comprises an inorganic material, and the second charge blocking layer comprises an inorganic material.

15. The photoelectric conversion device according to claim 9, wherein the inorganic material is an inorganic oxide.

16. The photoelectric conversion device according to claim 1, wherein the photoelectric conversion layer has a relative dielectric constant of 3 or more.

17. The photoelectric conversion device according to claim 1, wherein the photoelectric conversion layer comprises an organic material.

18. The photoelectric conversion device according to claim 1, wherein at least one of the pair of electrodes is a transparent electrode.

19. The photoelectric conversion device according to claim 18, wherein both of the pair of electrodes are a transparent electrode.

20. The photoelectric conversion device according to claim 1, wherein, of the pair of electrodes, the electrode in a light incident side is an electrode for collecting electrons generated in the photoelectric conversion layer.

21. The photoelectric conversion device according to claim 1, which comprises:
    a semiconductor substrate having at least one of the photoelectric conversion part stacked on an upper side thereof;
    a charge storage part provided in the semiconductor substrate, for storing a charge generated in the photoelectric conversion layer in the photoelectric conversion part; and
    a connecting part for electrically connecting an electrode for collecting the charge, which is one of the pair of electrodes in the photoelectric conversion part, to the charge storage part.

22. The photoelectric conversion device according to claim 21, further comprising an in-substrate photoelectric conversion part provided in the semiconductor substrate, for absorbing light which has transmitted through the photoelectric conversion layer in the photoelectric conversion part, generating a charge corresponding to the light and storing the charge.

23. The photoelectric conversion device according to claim 22, wherein the in-substrate photoelectric conversion part comprises plural photodiodes for absorbing light of a different color, respectively, the plural photodiodes being stacked in the semiconductor substrate.

24. The photoelectric conversion device according to claim 22, wherein the in-substrate photoelectric conversion part comprises plural photodiodes provided in the semiconductor substrate for absorbing light of a different color, respectively, the plural photodiodes being arranged in a direction vertical to a direction of the incident light.

25. The photoelectric conversion device according to claim 21, wherein
    one of the photoelectric conversion part is stacked on an upper side of the semiconductor substrate;
    the plural photodiodes are a photodiode having a p-n junction provided in a position suitable for absorbing blue light and a photodiode having a p-n junction provided in a position suitable for absorbing red light; and
    the photoelectric conversion layer in the photoelectric conversion part absorbs green light.

26. The photoelectric conversion device according to claim 21, wherein
    the charge stored in the charge storing part is electrons; and
    of the pair of electrodes in the photoelectric conversion part, the electrode in the light incident side is an electrode for collecting electrons.

27. A solid-state imaging device including a number of the photoelectric conversion device according to claim 21, provided in an array state, wherein a signal read-out part for reading out a signal corresponding to the charge stored in the charge storing part of each of the photoelectric conversion devices is provided.

* * * * *